(12) United States Patent
Luo et al.

(10) Patent No.: US 6,624,082 B2
(45) Date of Patent: Sep. 23, 2003

(54) SYSTEMS AND METHODS FOR TWO-SIDED ETCH OF A SEMICONDUCTOR SUBSTRATE

(75) Inventors: Laizhong Luo, Fremont, CA (US); Ying Holden, San Jose, CA (US); Rene George, San Jose, CA (US); Robert Guerra, Fremont, CA (US); Allan Wiesnoski, Pleasanton, CA (US); Nicole Kuhl, Sunnyvale, CA (US); Craig Ranft, Fremont, CA (US); Sai Mantripragada, Sunnyvale, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 09/907,127

(22) Filed: Jul. 16, 2001

(65) Prior Publication Data

US 2002/0017364 A1 Feb. 14, 2002

Related U.S. Application Data

(63) Continuation of application No. 09/351,259, filed on Jul. 12, 1999, now Pat. No. 6,335,293.
(60) Provisional application No. 60/092,758, filed on Jul. 13, 1998.

(51) Int. Cl.[7] .............................................. H01L 21/302
(52) U.S. Cl. ........................................ 438/724; 216/67
(58) Field of Search .................... 438/724, 744, 438/710, 727; 216/67, 79, 72; 134/1.1, 1.2, 1.3

(56) References Cited

U.S. PATENT DOCUMENTS

| 4,439,261 A | 3/1984 | Pavone et al. ............. 156/345 |
|---|---|---|
| 4,512,283 A | 4/1985 | Bonifield et al. ........... 118/723 |
| 4,624,728 A | 11/1986 | Bithell et al. ............... 156/345 |
| 4,736,087 A | 4/1988 | Whitlock et al. ...... 219/121 PG |
| 4,749,589 A | 6/1988 | Heinecke et al. ............. 427/39 |
| 4,812,201 A | 3/1989 | Sakai et al. ................ 156/643 |
| 4,842,683 A | 6/1989 | Cheng et al. ............... 156/345 |
| 4,854,263 A | 8/1989 | Chang et al. ............... 118/715 |
| 4,857,142 A | 8/1989 | Syverson .................... 156/646 |
| 4,901,667 A | 2/1990 | Suzuki et al. ............... 118/719 |
| 4,908,095 A | 3/1990 | Kagatsume et al. ........ 156/643 |
| 4,962,049 A | 10/1990 | Chang et al. .................. 437/13 |
| 5,024,748 A | 6/1991 | Fujimura ............... 204/298.38 |
| 5,075,256 A | 12/1991 | Wang et al. ................. 437/225 |
| 5,133,284 A | 7/1992 | Thomas et al. ............. 118/719 |
| 5,213,650 A | 5/1993 | Wang et al. ................ 156/345 |
| 5,230,741 A | 7/1993 | van de Ven et al. ........ 118/728 |
| 5,234,529 A | 8/1993 | Johnson ...................... 156/345 |
| 5,238,499 A | 8/1993 | van de Ven et al. ........ 118/724 |

(List continued on next page.)

FOREIGN PATENT DOCUMENTS

| EP | 0 379 828 A2 | 1/1990 | ............ H01J/37/32 |
|---|---|---|---|
| EP | 0 641 013 A2 | 1/1995 | ............ H01J/37/32 |
| JP | 58-132932 | 8/1983 | ......... H01L/21/302 |
| JP | 05-160077 | * 6/1993 | |
| WO | WO 91/10341 | 11/1991 | ............ H05H/1/24 |
| WO | 95/19825 | 6/1996 | ........... H01L/21/00 |

Primary Examiner—Shrive P. Beck
Assistant Examiner—Robert P Culbert
(74) Attorney, Agent, or Firm—Wilson Sonsini Goodrich & Rosati

(57) ABSTRACT

A system and method for two-sided etch of a semiconductor substrate. Reactive species are generated and flowed toward a substrate for processing. A diverter is positioned between the generation chamber and the substrate. A portion of the reactive species flows through the diverter for processing the front of the substrate. Another portion is diverted around the substrate to the backside for processing. A flow restricter is placed between the substrate and the exhaust system to increase the residence time of reactive species adjacent to the backside.

18 Claims, 16 Drawing Sheets

U.S. PATENT DOCUMENTS

| | | |
|---|---|---|
| 5,286,297 A | 2/1994 | Moslehi et al. ............. 118/723 |
| 5,332,441 A | 7/1994 | Barnes et al. ............... 118/723 |
| 5,374,594 A | 12/1994 | van de Ven et al. ........ 437/247 |
| 5,534,231 A | 7/1996 | Savas .......................... 216/67 |
| 5,540,800 A | 7/1996 | Qian .......................... 156/345 |
| 5,605,602 A | 2/1997 | DeBusk ................... 156/646.1 |
| 5,614,055 A | 3/1997 | Fairbairn et al. ........... 156/345 |
| 5,620,525 A | 4/1997 | van de Ven et al. ........ 118/728 |
| 5,693,182 A | 12/1997 | Mathuni .................. 156/645.1 |
| 5,700,725 A | 12/1997 | Hower et al. ............... 437/225 |
| 5,707,485 A | 1/1998 | Rolfson et al. .......... 156/643.1 |
| 5,811,022 A | 9/1998 | Savas et al. ................... 216/68 |
| 5,824,604 A | 10/1998 | Bar-Gadda .................. 438/725 |
| 5,914,278 A | 6/1999 | Boitnott et al. ............. 438/724 |
| 5,919,382 A | 7/1999 | Qian et al. ............. 219/121.52 |
| 5,964,949 A | 10/1999 | Savas ......................... 118/723 |
| 5,983,828 A | 11/1999 | Savas ......................... 118/723 |
| 6,074,953 A | 6/2000 | Donohoe et al. ........... 438/710 |
| 6,143,129 A | 11/2000 | Savas et al. ................ 156/345 |

\* cited by examiner

SYSTEMS AND METHODS FOR TWO-SIDED ETCH OF A SEMICONDUCTOR SUBSTRATE

REFERENCE TO RELATED APPLICATION

The present application is a continuation and claims priority from U.S. application Ser. No. 09/351,259 filed Jul. 12, 1999, now U.S. Pat. No. 6,335,293 which claims priority from U.S. provisional application No. 60/092,758 filed Jul. 13, 1998. U.S. application Ser. No. 09/351,259 and provisional application No. 60/092,758 are hereby incorporated herein by reference in their entirety.

BACKGROUND OF THE INVENTION

1. Field of the Invention

The field of this invention in general to semiconductor processing. More particularly, the field of the invention relates to systems and methods for simultaneously etching films deposited on both sides of the a semiconductor substrate.

2. Background

In semiconductor manufacturing, films may be grown and/or deposited on both sides of a wafer or other semiconductor substrate. These films often need to be removed after device structures have been defined by patterning and etching on one side of the wafer. The side of the wafer on which the devices are formed is typically referred to as the top, or front side of the wafer. The other side of the wafer, the side that does not have the devices formed thereon, may be referred to as the backside of the wafer.

One method for simultaneously removing these films from both sides of the wafer involves a wet etch bath. For example, silicon nitride films made in a low pressure chemical vapor deposition reactor have been used as a masking layer for selective oxidation in local oxidation of silicon (LOCOS) and shallow trench isolation (STI) technology. The nitride films may be removed using a hot phosphoric acid wet etch bath. Such wet baths can remove the films from both sides of a wafer simultaneously while offering other good characteristics such as high etch rates and high selectivity to any underlying films. However, a wet bath may become more disadvantageous as wafer sizes increase and the sizes of devices decrease. These disadvantages may include, among other things, the following: (i) chemical disposal may be expensive because frequent chemical change is required to guarantee stable process results; (ii) vapor from a typical wet bath is harmful to the operator's health and environmental isolation of the chemical for operation may be expensive; (iii) etch baths may leave undesirable residues and particles that adversely impact yield of small geometry devices; (iv) wet etches may not be suitable for the high aspect ratios common to newer and smaller submicron structures, (v) a single wet etch bath may be unable to etch multilayer films, whereas a dry etch may be able to remove multilayer films in one process chamber, and (vi) typically a whole cassette (or several cassettes) of wafers are at risk with wet etch and the cassette(s) could be lost if something goes wrong with the process or the robotics; dry etch processes are usually done one or two wafers at a time.

One type of dry etch system that may be used for two-sided etching is the barrel etcher. This type of etcher has been used for photoresist stripping, but may have disadvantages such as a strong wafer-to-wafer or within-wafer loading effect, poor etching uniformity, susceptibility to particulate generation due to the lack of a vacuum load lock, and risk of loss of a full cassette or multiple cassettes of wafers if the process fails.

As wafer size increases and device features decrease, process requirements become more stringent. As a result, what is desired is an isotropic etcher which provides improved process performance and control, in-situ end point monitoring so that the process duration is correctly controlled for each wafer, and reduced particle contamination.

Since typical plasma etchers etch one side of a wafer at a time, special care must be taken to remove the unwanted material from the backside without allowing sensitive materials on the front side to be damaged. One approach to is to coat the front side of the wafer with photoresist and turn it upside down to etch the backside. Another approach is to put the plasma source beneath the wafer. In this latter technique a non-reactive gas may be flowed across the front side of the wafer for protection of the device features while the backside is etched. After the backside etch is completed, the front side may be etched in a conventional manner. Although this approach can be effective, throughput is limited because the front and backside etches are not done simultaneously.

Simultaneous two-sided etching of a wafer is difficult to carry out in many conventional plasma etchers, particularly when the device features are sensitive to process conditions. For instance, in LOCOS nitride processes, a film of silicon nitride (which may be about 1,000 angstroms thick) may be deposited on both sides of the wafer. The film becomes a mask and is used to define where field oxide will be grown by protecting surfaces on the front side of the wafer that eventually will become the contacts and gates of transistors. The exposed and/or underlying areas may be very sensitive to etching of the silicon, ion bombardment or ultraviolet light, any of which contributes to damage causing mechanisms. The etch process to remove silicon nitride must be highly selective, with an etch rate selectivity of silicon nitride to silicon oxide of about 30:1 or greater. Other sensitive processes include shallow trench isolation which may require nitride to oxide selectivities as great as 100:1, depending on whether the front or back side is etched faster. In some embodiments where the backside of the wafer could be etched faster than the front the selectivity might only need to be about 40:1 (as in the LOCOS process).

In a two-sided etch where both sides of a wafer are etched simultaneously, it is sometimes desirable to have both the front side and backside etch rates approximately in proportion to the average thicknesses to be etched on front and backsides of the wafer. Otherwise, one side would have to be overetched longer than the other and the selectivity to other layers on that side would have to be increased even further to avoid damage. In some applications, it can be desirable to have the backside etch rate faster than the front side etch rate, as much as three times faster in shallow trench isolation or possibly other new processes. Obtaining this kind of control in a single wafer plasma etcher is difficult when the reactant is provided to the wafer from only one side (typically the front side). While plasma etchers such as reactive ion etchers may be able to perform a two-sided etch by processing wafers on lift pins, the hardware underneath the wafer may limit the backside etch rate or result in non-uniformities. Also, if the wafer is exposed directly to the plasma, ion bombardment, UV exposure, and charging effects may damage sensitive features.

What is desired are systems and methods for a simultaneous two-sided etching one or more of the following with: (i) reduced damage from ion bombardment and ultraviolet light; (ii) high selectivity to underlying layers; (iii) high back to front etch rate ratio; (iv) good etch rate uniformity on both sides of the wafer; and (v) a high rate of etching on both sides of the wafer in a single processing step to allow for high throughput. It is particularly desirable to have an appropriate of each of these features in combination.

SUMMARY OF THE INVENTION

One aspect of the present invention provides a reactor system for etching two sides of a semiconductor substrate. An exemplary reactor system comprises a generation chamber for producing reactive species, a gas inlet for providing gas to the generation chamber, a process chamber within which a semiconductor substrate is processed, and a gas outlet for exhausting gas from the process chamber. Within this reactor system the gas flows generally from the generation chamber to the process chamber and is then exhausted. Within the process chamber is a support for the substrate which exposes both front and backsides of the substrate, and a diverter which: (a) allows a first portion of the flow of reactive species from the generation chamber to flow to one side of the substrate; and (b) diverts a second portion of the flow of reactive species around the diverter and the substrate to flow to the other side of the substrate.

Another aspect of the present invention provides a diverter configured so that a first portion of the flow of reactive species either passes through the diverter, or to some degree goes around it, or both, to reach the region between the diverter and a first side of the wafer. In this context, the "first side" of the wafer is the side of the wafer substantially facing the diverter, and thus the first side may be either the front or the backside of the wafer. A second portion of the flow of reactive species bypasses the diverter and avoids the region between the diverter and the first side of the wafer. This is achieved, in part, because some of the gas flow from the generation region is diverted in a direction substantially parallel to the diverter so that it does not penetrate the region between the first side of the wafer and the diverter. Both the first and second portions of the stream of gaseous species flow past the second side of the wafer. In this context, the term "second side" is the side of the wafer that is substantially facing away from the diverter. In flowing past the first and second sides of the wafer the reactive gaseous species cause some of the materials on the wafer surfaces, both first and second sides, to be etched in an adequately selective and uniform manner.

Another aspect of the present invention provides a method for processing a substrate on a set of pins to sufficiently remove the material between the pins and the wafer without having to move the wafer to a second set of pins wherein the area contact of the second set does not overlap the area contact of the first set.

A further aspect of the present invention provides method for two-sided etch that allows the following process results to be balanced in a desired manner: (i) etch rate uniformity and etch rate selectivity on the first side of the wafer, (ii) first side to second side etch rate ratio, and (iii) second side etch rate uniformity.

Aspects of the present invention allow for simultaneous etching of films on both sides of a semiconductor substrate. Aspects of the invention may be used with virtually any source of reactive species, including those utilizing plasma sources, providing species to a downstream wafer-processing chamber. In one embodiment, the substrate is supported by three sharp-tipped pins so that both sides of the substrate are exposed to reactive species for etching. A first portion of the flow of reactive species generated in the reactive species source is provided to one side (this may be the front side) of the substrate for reaction. A second portion of the flow is directed around substrate to the other side (which may be the backside) where it is then pumped out of the process chamber. To provide a sufficient and appropriate flow of reactive species to the backside of the substrate, a gas flow diverter is placed between the reactive species generation chamber and the substrate to reduce the flow to the front side. This causes some of the reactive species to flow to the backside of the wafer without having passed adjacent to the front side of the wafer. A flow restricter may then be placed between the substrate and the exhaust port to increase the residence time and likelihood of reactive species adjacent to the second (may be the backside) of the wafer.

Various types of diverters and combinations of diverters, baffles, and restricters can be used in embodiments of the present invention to achieve the desired process results. The diverter used in some embodiments may comprise one or more plates, and at least one of those plates may contain a hole or pattern of holes. The diameter of the diverter, hole pattern, hole size, and distance of separation between the diverter and the substrate may be adjusted to achieve the desired process results. In one embodiment, the diverter may also screen the line of sight from the plasma to the substrate, minimizing UV radiation and charging damage, thus contributing to process optimization. In the case where the diverter consists of more than one plate, exemplary embodiments may include configurations in which that part of the diverter closest to the wafer has holes for gaseous species to flow through to the wafer. This multi-plate diverter may be used to prevent line-of sight to the wafer from the generation region, which may contain a plasma.

Another aspect of the present invention provides for a flow restricter located downstream from the wafer with respect to the flow of reactive gases. As with the diverter, the flow restricter may comprise a plate with a hole pattern (or other mechanism to restrict gas flow) where the holes provide an exit path to the exhaust pump. The hole size and shape may be selected to be both small enough to provide a long residence time for reactive species, but also large enough to allow for sufficient gas flow conductance. The distance of the plate or other restriction mechanism to the substrate with respect to the substrate diameter may be selected to achieve the desired backside etch rate and uniformity. The shape of the bottom plate or other mechanism may also be varied to optimize process results.

It is an advantage of the foregoing and other aspects of the present invention that high selectivity, low ion damage, good etch rate (e.g., 200 to 1,000 angstroms per minute) and good uniformity may be achieved in a simultaneous two-sided etch process.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION

Aspects of the present invention may be used in conjunction with any variety of plasma source, including those using inductively coupled plasma sources, helical resonators and microwave plasma sources. Descriptions of additional exemplary reactor configurations and processes which may be used in conjunction with aspects of the present invention are provided in U.S. Pat. Nos. 5,534,231, 5,234,529, 5,811,022, U.S. patent application Ser. No. 08/811,893 filed Jan. 23, 1996 and assigned to the assignee of the present application, U.S. patent application Ser. No. 09/192,810 filed Nov. 16, 1998 and assigned to the assignee of the present application, U.S. patent application Ser. No. 09/200,660 filed Nov. 25, 1998 and assigned to the assignee of the present application, and U.S. patent application Ser. No. 09/192,835 filed Nov. 16, 1998 and assigned to the assignee of the present application, each of which is incorporated herein by reference in its entirety. In particular, to enhance throughput and reduce redundancy of components in a commercial embodiment, dual wafer, dual plasma generation chamber configurations may be used as described in U.S. Pat. No. 5,811,022 and U.S. patent application Ser. No. 08/811,893.

Figure 1A:
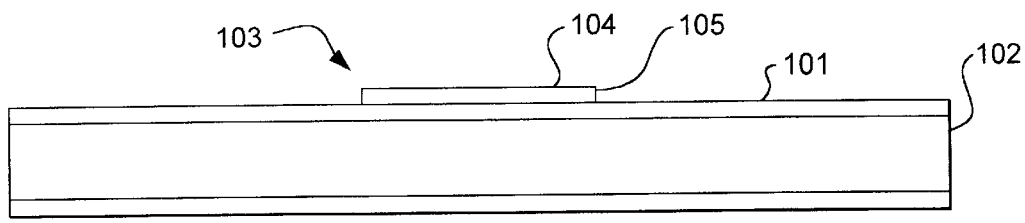
FIGS. 1A, 1B and 1C illustrate side cross-section views of a semiconductor substrate during the steps of an exemplary nitride mask removal process.
Figure 1B:
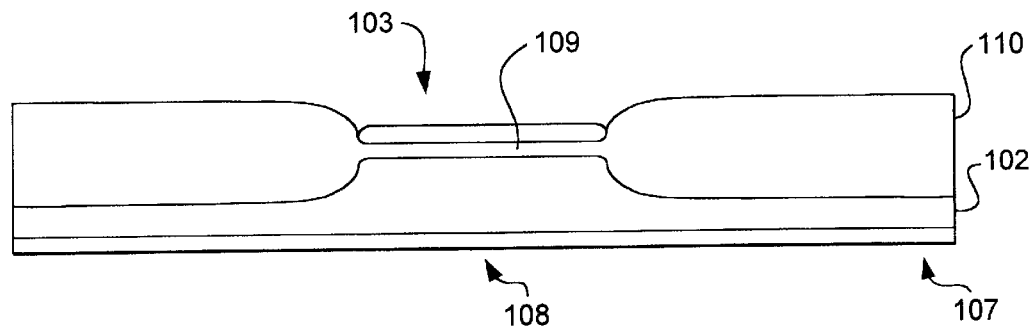
Figure 1C:
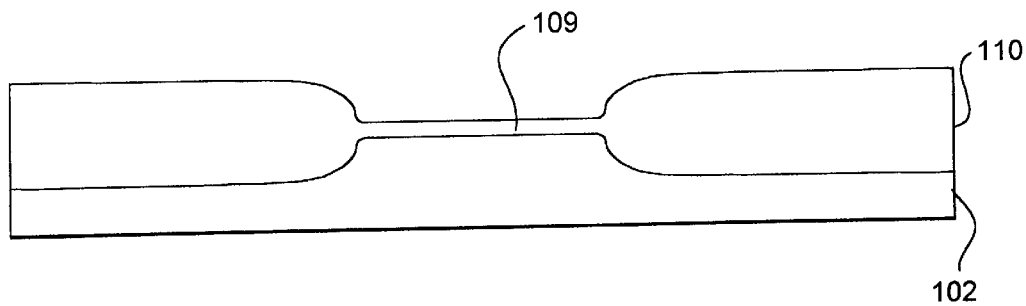

One example of a type of masking layer that may be removed using aspects of the present invention is a silicon nitride film used in a LOCOS application as depicted in FIGS. 1A–C. In FIG. 1A, silicon dioxide layer 101 has been disposed on substrate 102, which may be, for example, a silicon wafer. Masking layer 103 in FIG. 1A has, in turn, been deposited and patterned on top of oxide layer 101. The masking layer 103 may comprise a dual layer of silicon oxynitride 104 on silicon nitride 105 as shown in FIG. 1A, but will generally be referred to as a nitride masking layer 103 in this example. Note that the operation of depositing nitride on the front side of the wafer also deposits nitride layer 106 on the backside.

As shown in FIG. 1B, oxide layer 101 has been grown in the unprotected (unmasked) regions to form essentially two parts, pad oxide 109 and field oxide 110. Nitride mask 103 protects oxide layer 101 in a region so that pad oxide 109 does not grow in thickness, and does not become as thick as field oxide 110. Pad oxide 109 may be of order 100 angstroms thick, or less.

As shown in FIG. 1C, nitride layer 103 on the front side of the wafer and nitride layer 106 on the backside of the wafer are then removed. The importance of having a sufficient nitride to oxide etch rate selectivity (which may be, for example, about 40:1), at least during the latter stages of the removal of nitride layer 103, is to minimize etching of the extremely thin pad oxide 109 while at the same time completely removing nitride 103. The high selectivity that is desired for the front side of the wafer must be balanced with achieving an adequate nitride etch rate on the backside. In fact, the nitride etch rate uniformity on the backside of the wafer may be as important a parameter as the absolute etch rates themselves; this insures that nitride 108 at the center of the backside is removed as quickly, or nearly as quickly, as nitride 107 at the edge of the backside.

The following are important parameters for the above process: (i) the nitride to oxide etch rate selectivity on the front side of the wafer (which is the ratio nitride 103 etch rate:oxide 109 etch rate), (ii) the uniformity of etching on the front side of the wafer, (iii) the nitride etch rate ratio of the back to the front (which is the ratio nitride 106 etch rate:nitride 103 etch rate), and (iv) the nitride etch rate uniformity on the backside of the wafer, defined as the amount of nitride 108 etched minus amount of nitride 107 etched, divided by the average, in percent.

Of course, aspects of the present invention may be used in any variety of processes where it is desirable to etch a material from both sides of a semiconductor substrate. In particular, it may be desirable to etch any variety of nitride and/or polysilicon layers with a high selectivity relative to oxide and/or silicon containing layers using aspects of the present invention.

Figure 2:
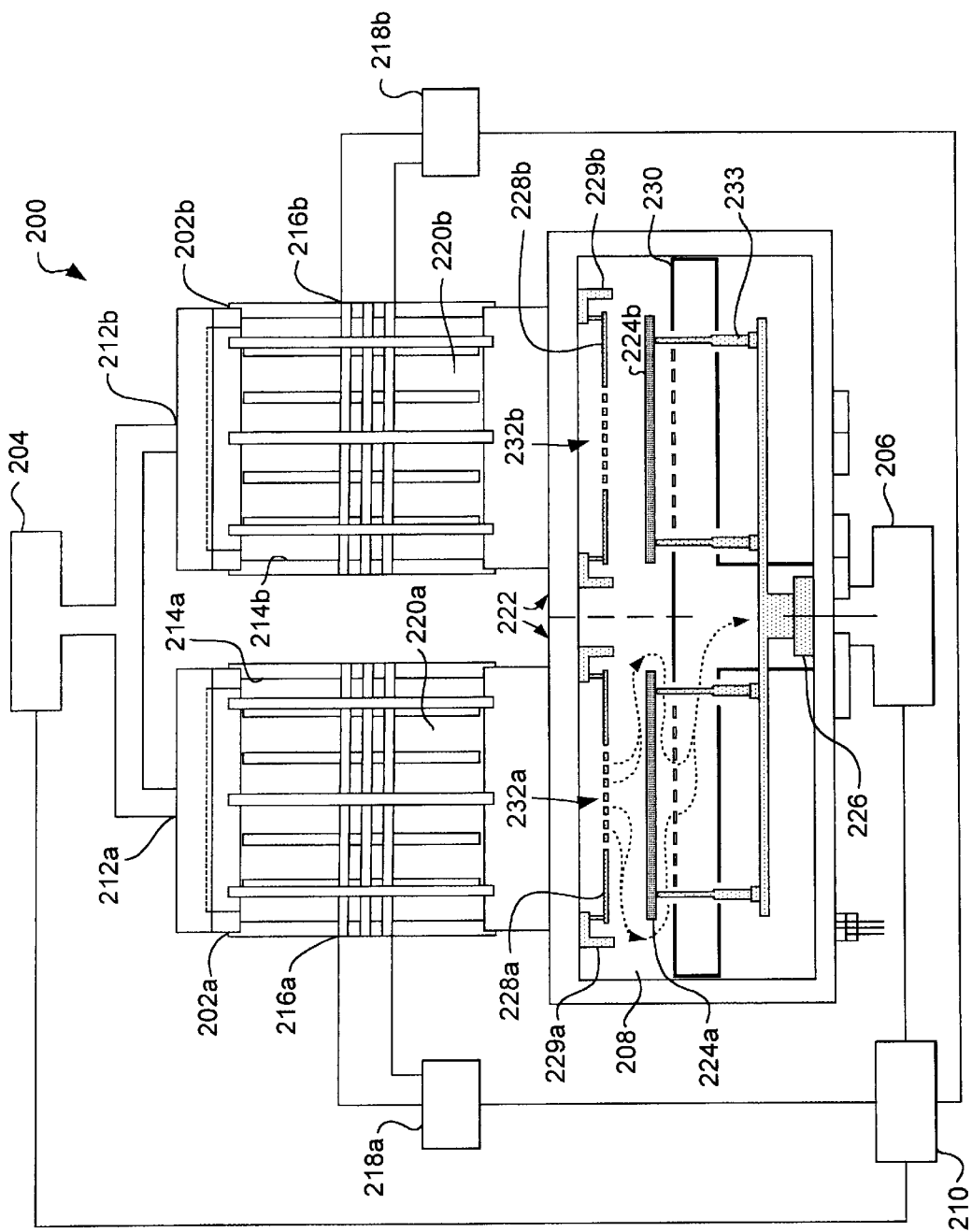
FIG. 2 is a side cross-section and partially schematic view of a two-sided etch plasma reactor according to an exemplary embodiment of the present invention.

The reactor of FIG. 2 may be used to achieve the desired front side uniformity and selectivities, back to front etch rate ratios, and backside uniformities for a two-sided etch process, such as the sample processes described above. FIG. 2 is a side cross-section and partial schematic view of a reactor, generally indicated at 200, according to an exemplary embodiment of the present invention. In this embodiment, two cylindrical plasma generation chambers 202a and 202b are arranged side by side. Similar components are used in conjunction with the two plasma generation chambers 202a and 202b. These similar components are labeled with the same reference numeral for each chamber in FIG. 2, but suffixes "a" and "b" have been added to differentiate between the components for generation chambers 202a and 202b, respectively. These components may be referred to generally by their reference numeral without any appended suffix. While the two generation chambers use substantially duplicate elements and operate substantially independently, they share a gas supply system 204, an exhaust system 206, wafer processing chamber 208 and controller system 210. The system of the third embodiment is configured for concurrent processing of two wafers which doubles throughput.

In the embodiment of FIG. 2, the gas supply system 204 is configured to provide a gas mixture into the plasma generation chambers 202 through gas inlets 212a and 212b at a desired flow rate. The plasma generation chambers generate a plasma to produce active species for the etch process. The chamber walls 214a and 214b are made of a non-conductive material such as quartz or alumina. Encircling the generation chamber walls 214 are induction coils 216a and 216b. The induction coils are connected to a power supply system 218a and 218b (which may comprise an RF source and a conventional impedance match network). The power supply system is configured to provide radio frequency (RF) power to the induction coil at a desired power level and frequency, which may be for example a power of between about 500 and 1500 watts and a frequency of 13.56 MHz. Of course, other power levels and frequencies may be used as desirable for generating particular plasma properties (such as pulsed power with high power during certain cycles as described in U.S. patent application Ser. No. 08/727,209, incorporated herein by reference). The induction coil inductively couples RF power into the gases in the plasma generation chamber to form a plasma and thereby generate active species for processing.

In the embodiment of FIG. 2, a split Faraday shield 220a and 220b is interposed between the induction coil and the plasma. The bottom of the split Faraday shield may be coupled to the top 222 of processing chamber 208 (or other path to ground) to provide a common ground for all of the sections of the split Faraday shield. The split Faraday shield reduces capacitive coupling of power into the plasma generation chambers (which can modulate the plasma and drive ions into the walls and toward the wafers), but allows power to be inductively coupled into the generation chambers to produce a plasma. The shield can be configured to allow a desired level of capacitive coupling and modulation to make igniting the plasma easier and to control the power, composition and other properties of the plasma.

Any variety of plasma sources may be used in alternate embodiments of the present invention including, for example, (i) an inductively coupled plasma generation chamber with or without a split Faraday shield as described in U.S. Pat. Nos. 5,811,022 and 5,534,231, (ii) a microwave plasma source, resonant cavity, waveguide and/or ECR type chamber, (iii) a capacitively coupled plasma using RF excitation, (iv) a UV light source to dissociate a species or plurality of species in the feedgas, (v) a region for mixing gases that spontaneously react to create reactive radicals, (vi) a thermal cracking cell in which there is a high temperature element to dissociate one or more gases, and/or (vii) an ultra high frequency (UHF) plasma source using frequency of excitation from 10 MHz to 1.0 GHz.

The generation chamber generates reactive species from gases for processing which flow into processing chamber 208 and across the surfaces of substrates 224a and 224b. Exemplary gases used for LOCOS (local oxidation of silicon) or STI (shallow trench isolation) processes where silicon nitride is to be etched may include (i) a source of fluorine, which may be a fluorinated hydrocarbon such as $CF_4$, or which may be $NF_3$ or $SF_6$, (ii) a source of hydrogen (which may be a dilute mixture in an inert gas) and may comprise $NH_3$, $CH_3OH$ or $H_2O$, or a fluorocarbon which is not a perfluoro compound such as $CH_2F_2$ or $CHF_3$ and (iii) a source of oxygen, which may be $O_2$, $H_2O$, or $N_2O$. The gas flow may range from about 10 SCCM to a few thousand SCCM for each component gas, or any range subsumed therein. A gas outlet 226 is located at the bottom of the process chamber below the substrates and may be coupled to gas exhaust system 206 for exhausting gases from the processing chamber. Gas supply system 204 and gas exhaust system 206 are configured to maintain a desired pressure in the processing chamber for the given process, which may range, for instance, from about 0.03 Torr to atmospheric pressure, or any range subsumed therein. Exemplary pressures and gases for various plasma sources and processes are described further below and are disclosed in the above-referenced applications which have been incorporated by reference.

In the embodiment of FIG. 2, the active species from the plasma flow across both the front side and backside of the substrates in the processing chamber. The active species react with nitride or other layers to be etched and thereby simultaneously etch both sides of the substrate. Structures are placed in the processing chamber (and/or built into the processing chamber wall) to control the flow of active species so that each side of the substrate is etched at a desired rate. In particular, it may be desirable to divert a sufficient flow to the backside, so that the backside is etched at a higher rate (e.g., when the nitride layer is thicker on the backside). In addition, species may be exhausted from the center of the backside, and the exhaust flow may be restricted, to ensure that species are resident near the backside for a sufficient period for etching. In the embodiment of FIG. 2, the flow may be controlled by using a gas diverter 228 and/or a flow restricter 230. The diverter 228 allows reactive species to flow across the front side of substrate 224, but also diverts a portion of the flow toward the backside. In the embodiment of FIG. 2, the diverter is essentially a plate (shaped substantially symmetric about an axis perpendicular to and through the center of the substrate) which has holes 232 that allow a portion of the reactive species to flow directly to the surface of the substrate facing the diverter (which, here, is the front side) and also forms an opening at its periphery that causes a portion of the reactive species to flow past the edges of the substrate toward the surface facing away from the diverter (which, here, is the backside). A skirt 229 may surround the diverter to direct the peripheral flow toward the substrate. Examples of materials from which the diverter and skirt may be constructed are aluminum, anodized aluminum, Teflon, and/or quartz, or ceramics which may include metal oxides or fluorides which are not etched by the reactive species. The diverter may also be made of other materials including ceramics, or stable metallic oxides or fluorides and coated with a non-reactive, preferably smooth coating such as sapphire or other unreactive material such as ceramic, Teflon or compound such as a stable metallic oxide or fluoride.

Facing the second side of the substrate (that is to say, the side of the substrate that does not face the diverter) is flow restricter 230, whose purpose is to provide sufficient residence time of reactive species to process the second side of the substrate. The flow restricter may be formed from a plate of non-reactive material, such as aluminum, Teflon, and/or quartz or ceramic, or other materials coated with a relatively non-reactive coating such as ceramic or unreactive metallic oxide or fluoride. In the exemplary embodiment, the flow restricter comprises a plate with holes symmetrically clustered in the center of the plate, which are used to restrict gas flow through gas outlet 226. The holes are concentrated within a few inches in the center behind the substrate. The holes should be large enough for good flow conductance, but allow sufficient residence time of reactive species on the second side of the substrate for the desired etching. The hole size and pattern may be selected to balance front and backside etch rates, while maintaining the desired nitride:oxide selectivity on the front side of the wafer. The distance between flow restricter 230 and substrate 224 may also be adjusted for optimum selectivities, etch rates, and uniformities.

In the embodiment of FIG. 2, the diverter is about 0.5 to 3 inches above the substrate and the restricter is about 0.5 to 3 inches below the substrate, although the distances may be adjusted to achieve a desired flow. In specific embodiments, the diverter may be about 1 inch above the wafer and the restricter may be about ¾ inch below. In another embodiment, the diverter is either 2.43 or 2.62 inches above the wafer (depending on the position of support pins) and the restricter is either 1.3 or 1.12 inches below. In alternate embodiments, a diverter may be formed as part of the top 222 of processing chamber 208 and a restricter may be formed in the bottom of the processing chamber. In such an embodiment, the height of the processing chamber would be adjusted to provide desired flows across the front and back sides of the substrates; however, there would be less flexibility to adjust the flows for different processing by replacing the diverter and restricter with different configurations and by moving them relative to the substrate surfaces. Exemplary diverters and flow restricters which may be used in conjunction with embodiments of the present invention are described further below.

The gas supply system 204, exhaust system 206, power supply systems 218a and 218b may be coupled to a controller system 210 in the embodiment of FIG. 2. The controller system may be configured to control the overall process, including gas flow, pressure, power level, power frequency, power pulsing (if any) and other parameters and components (such as wafer insertion and removal robotics and load locks, for example, as described in U.S. patent application Ser. No. 09/200,660). The controller system may comprise software configured on one or more computer systems or circuitry configured to control the operation of the respective components. It will also be readily apparent that control may alternately be distributed across control software and/or circuitry included in or associated with the various reactor systems and components (e.g., gas supply system 204, exhaust system 206, power supply systems 218a and 218b). The control system (or distributed controllers) allows each of the process parameters to be controlled for automated processing.

Figure 3:
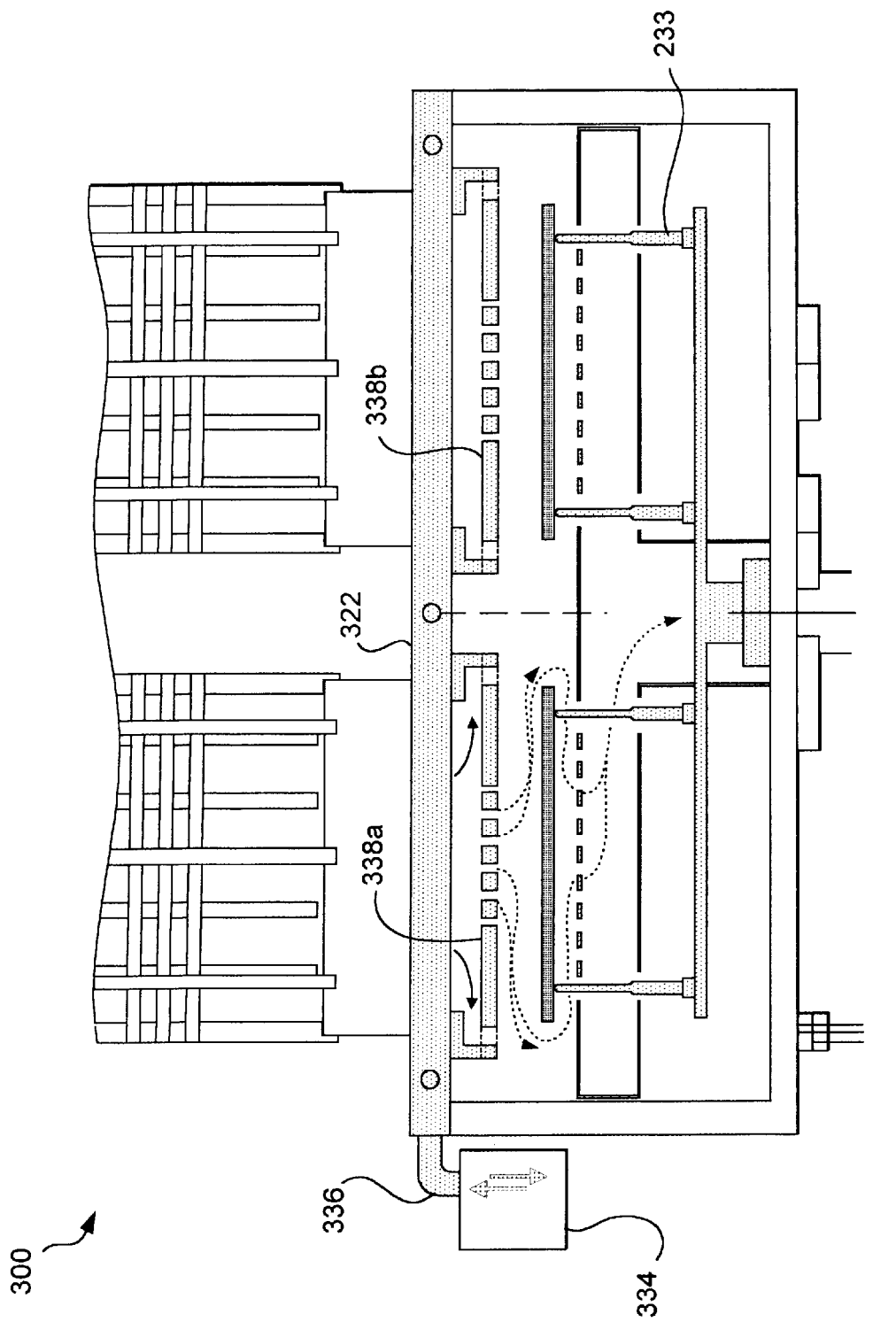
FIG. 3 is a side cross-section of a portion of a reactor according to an exemplary embodiment of the present invention.

FIG. 3 is a side cross section of a portion of a reactor system, generally indicated at 300, with a configuration similar to that described above in connection with FIG. 2. However, in the embodiment of FIG. 3, the diverter 338 is thicker and the top 322 of processing chamber 308 is actively cooled. A cooling system 334 pumps water or another coolant through inlet 336 and circulates it through pipes or channels in the top 322 of the processing chamber. Any variety of coolants or mechanisms for actively cooling the top plate may be used in various embodiments. In exemplary embodiments, the top plate may be cooled to maintain its temperature in the range of from about 0 to 50 degree Celsius, or any range subsumed therein, with a temperature of about 25 degrees Celsius being a typical example. This helps cool the processing chamber and reactive species which can reduce the etch rate for the oxide (which is not desired to be etched by the process). The etch rate of the nitride is not reduced as much, so the selectivity of the process (etch rate of nitride relative to oxide) increases. Cooling may be desirable when the etch rate of a layer which is not desired to be etched (e.g., oxide) is reduced more than the etch rate of a layer that is desired to be etched (e.g., nitride), because selectivity is increased. The level of cooling can be selected to balance the selectivity with the overall etch rate.

Figure 4:
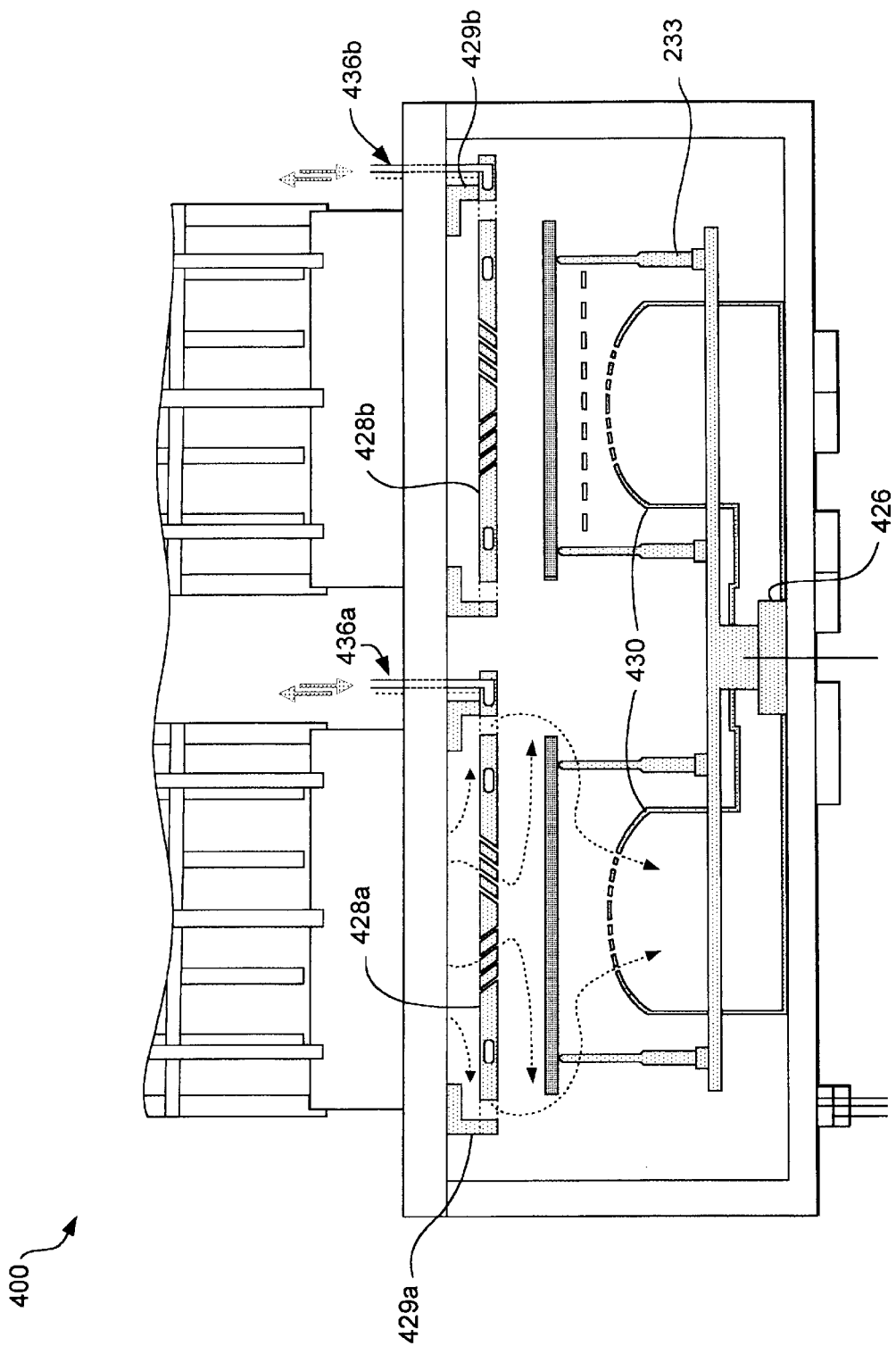
FIG. 4 is a side cross-section of a portion of a reactor according to another embodiment of the present invention.

FIG. 4 is a side cross section of a portion of a reactor system, generally indicated at 400, with a configuration similar to that described above in connection with FIG. 2. However, in the embodiment of FIG. 4, the configurations of the diverter 428 and restricter 430 are different and the diverter 428 is actively cooled. A cooling system (not shown in FIG. 4) pumps water or another coolant through inlets 436a and 436b and circulates it through pipes or channel in the diverter. Any variety of coolants or mechanisms for actively cooling the diverter may be used in various embodiments. In exemplary embodiments, the diverter may be cooled to maintain its temperature in the range of from about 0 to 50 degree Celsius, or any range subsumed therein. As described above, the cooling can be used to increase selectivity.

In addition, the embodiment of FIG. 4 has a diverter 428 that is thicker and has channels angled toward the center of the substrate. This promotes a flow of reactive species over the center of the front side of the substrate and may reduce ion bombardment and UV exposure of the wafer through the holes. The restricter 430 below the substrate has a convex shape. For both the diverter and the restricter, the thickness, angle of channels for gas flow, distance from the substrate and the curvature can be selected and adjusted to promote the desired flow of reactive species to enhance uniformity and balance front to back side etch rates.

In each of the above embodiments, the substrate may also be cooled before being etched to improve selectivity. For example, a wafer may be cooled to a temperature of between about zero and 25 degrees Celsius prior to processing. This could be accomplished by placing the wafer on a cold plate in an adjacent chamber before being inserted into the etch chamber. The wafer is then at the lower temperature during the etch process than it otherwise would have been. The result is a slower oxide etch rate and an accompanying increase in the nitride to oxide selectivity.

In each of the above embodiments, the substrates 224 may be supported on sharp pins 233 (which may be pointed standoffs) during processing. Of course, in alternate embodiments, an edge support or other support that leaves the areas to be etched exposed may be used. If an area that is desired to be etched is covered, the substrate may have to be repositioned on the same or different support to expose the area for etching and in some embodiments, may necessitate a two step etch process.

With pins 233, the removal of material is accomplished without the necessity of relocating the substrate from its original position on pins 233 to a second set of pins (not shown); in other words, the nitride material on the backside of the substrate 224 between the pins and the substrate is sufficiently removed even while the substrate is being supported by the pins. Placement of the pins towards the edge of the substrate may be helpful for situations where the front side of the wafer may be etched as fast or faster than the backside (such as LOCOS applications) partly because the backside etch is faster at the edge than at the center.

Figure 5:
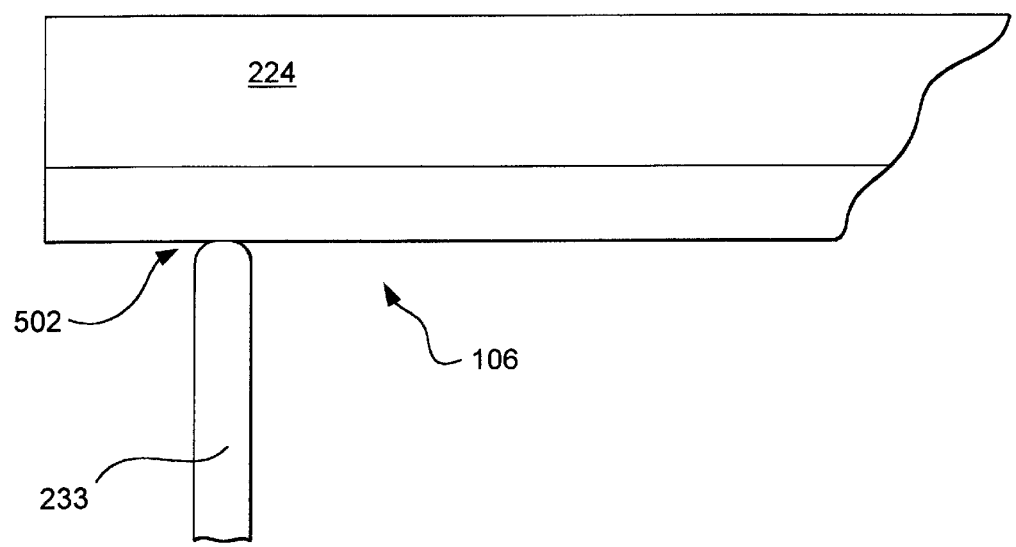
FIG. 5 illustrates an exemplary embodiment of a pin structure for supporting the substrate.

The contact area between the pins and the wafer is small in the exemplary embodiment. The pins may have a spherical shape at the tip, as illustrated by reference numeral 502 in FIG. 5, with a radius of curvature of about 3 microns to about 50 microns. The pins are made from a durable, non-reactive material such as sapphire or other inert ceramic material or may be coated with sapphire or inert ceramic material.

In some embodiments, the pins may be moveable to adjust the position of the substrates for processing or to facilitate insertion and removal of the substrates from the processing chamber. In specific embodiments, the pins may be moved between two different processing positions, an "up" position (about 5.53 inches from the bottom of the processing chamber) and a "down" position (about 5.35 inches from the bottom of the processing chamber).

Figure 6:
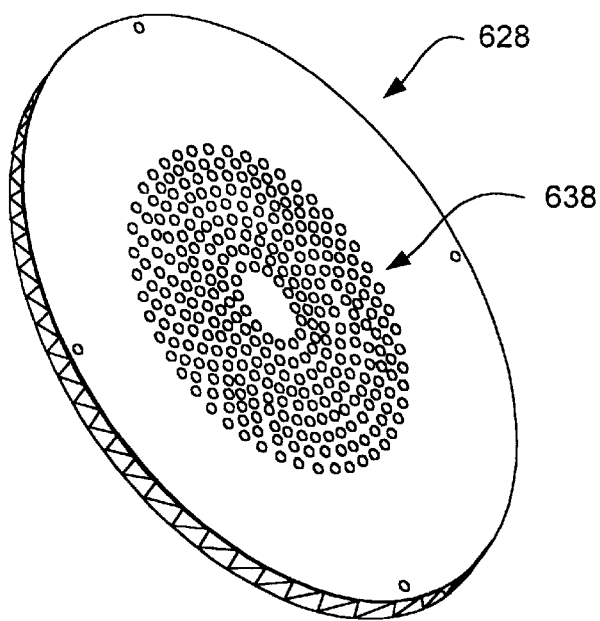
FIG. 6 shows an exemplary diverter according to an embodiment of the present invention.
Figure 7:
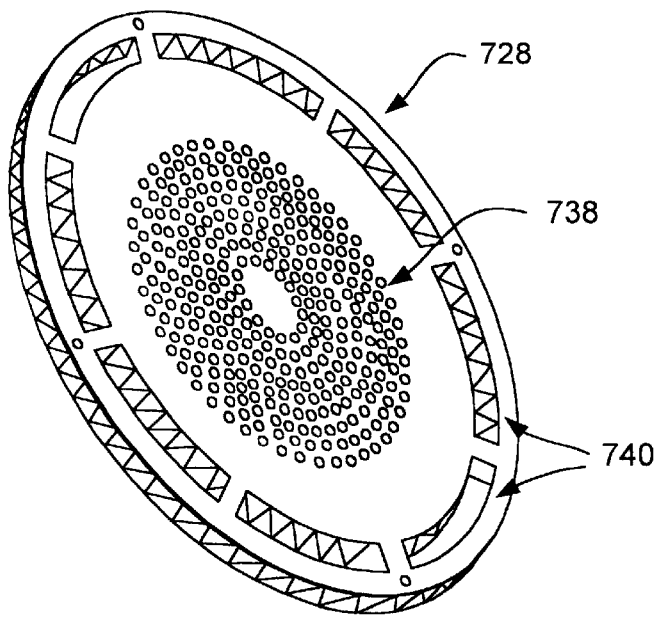
FIG. 7 shows an exemplary diverter according to an embodiment of the present invention.

FIGS. 6 and 7 illustrate exemplary diverters which may be used in conjunction with exemplary embodiments of the present invention. Diverter 628 in FIG. 6 is a plate which is round in shape, or otherwise substantially symmetric about an axis perpendicular to and through the substrate center. Diverter 628 contains hole pattern 638 to allow gas to flow from a plasma generation chamber 202, through the diverter (in a direction substantially normal to the diverter). This provides a flow which favors the first side of the substrate (facing the diverter), although gas will also flow along the backside. Reactive species which diffuse to and strike the plate at a region where there are no holes cannot find a path through the plate, and these species may instead travel in a radial direction (parallel to the plate and towards the outside edge of the plate) around the diverter. The flow around the periphery of the plate tends to bypass the first side and travel around the edge of the wafer to the backside (although some gas may nonetheless travel to the front side). The size and arrangement of the holes and the size of the region at the periphery where gas can flow around the diverter can be adjusted to achieve a desired flow of reactive species. Diverter 728 in FIG. 7 is similar to diverter 628, except that it contains a multiplicity of slots 740 in an annular arrangement close to the outside edge of the diverter to enhance the flow to the backside of the substrate. In the embodiment of FIG. 7, the gas flows around the periphery of the diverter as well as through the slots to enhance flow toward the backside. In alternate embodiments, however, the edge of the diverter may extend to the wall of the plasma generation chamber, so gas does not flow around the substrate and rather flows only through the slots.

Additional features of the structure of the diverter involve its diameter, distance of separation from the substrate, and hole size. The exemplary diverters of FIGS. 6 and 7 are at least as large in diameter as the substrate, and may be up to 40 percent larger or more. Generally, however, the diverter is about 5% to 20% larger in diameter than the substrate. Because the diverter is essentially 5 to 20 percent larger in diameter than the substrate, the "diverted" gas tends to flow around the plate and past the edges of the substrate to the backside (generally bypassing the front side). Of course, the actual gas flows may be complex and some gas from the periphery may flow to the front side initially; however, the flows around the diverter tend to favor backside etching, while the flows through the holes in the center tend to favor front side etching.

In the exemplary embodiments of FIGS. 6 and 7, the holes comprising the hole pattern have a diameter of less than about 0.2 inches. In general, for the embodiments shown in FIGS. 6 and 7, the hole size may range from about 0.1 to 0.2 inches, with 0.10 inches being used in specific exemplary embodiments. Of course, the hole size and pattern may be varied to adjust the flow as desired.

For the exemplary embodiments described above, the distance separating the diverter from the first side of the substrate ranges from about 5 to 50 percent of the substrate diameter. For an eight inch wafer, in one embodiment, the distance may range from about 0.2 to 1.0 inch, or more typically, from about 0.4 to 0.6 inches. In another embodiment, the distance ranges from 2 to 3 inches. Of course the distances may be modified to produce desired flows and etch rates, depending upon the particular gases, material being etched, wafer size, gas flows and pressure and distance of the restricter from the backside.

Figure 8A:
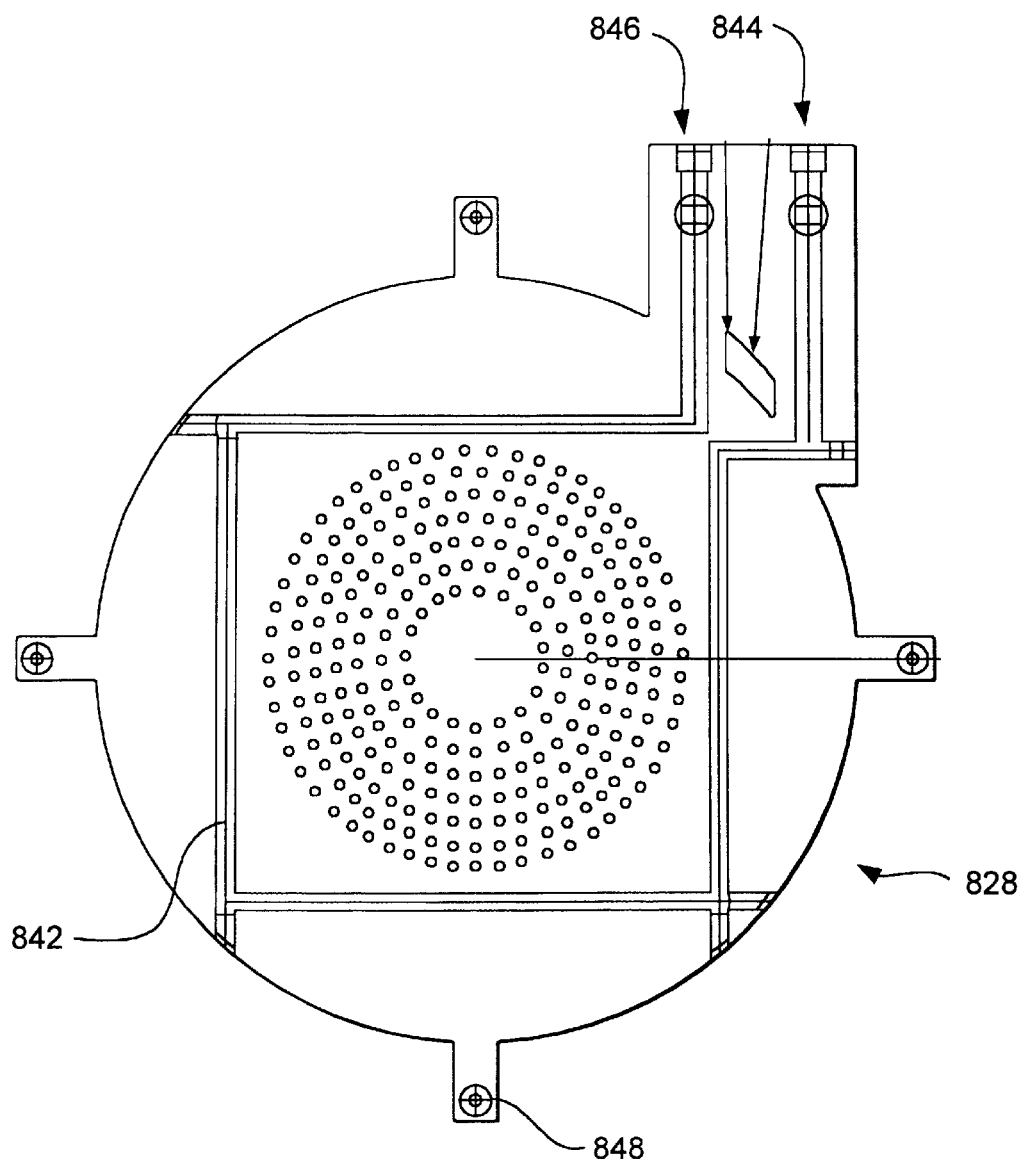
FIGS. 8A and 8B are a top plan view, and a perspective view, respectively, of a diverter according to an exemplary embodiment of the present invention.
Figure 8B:
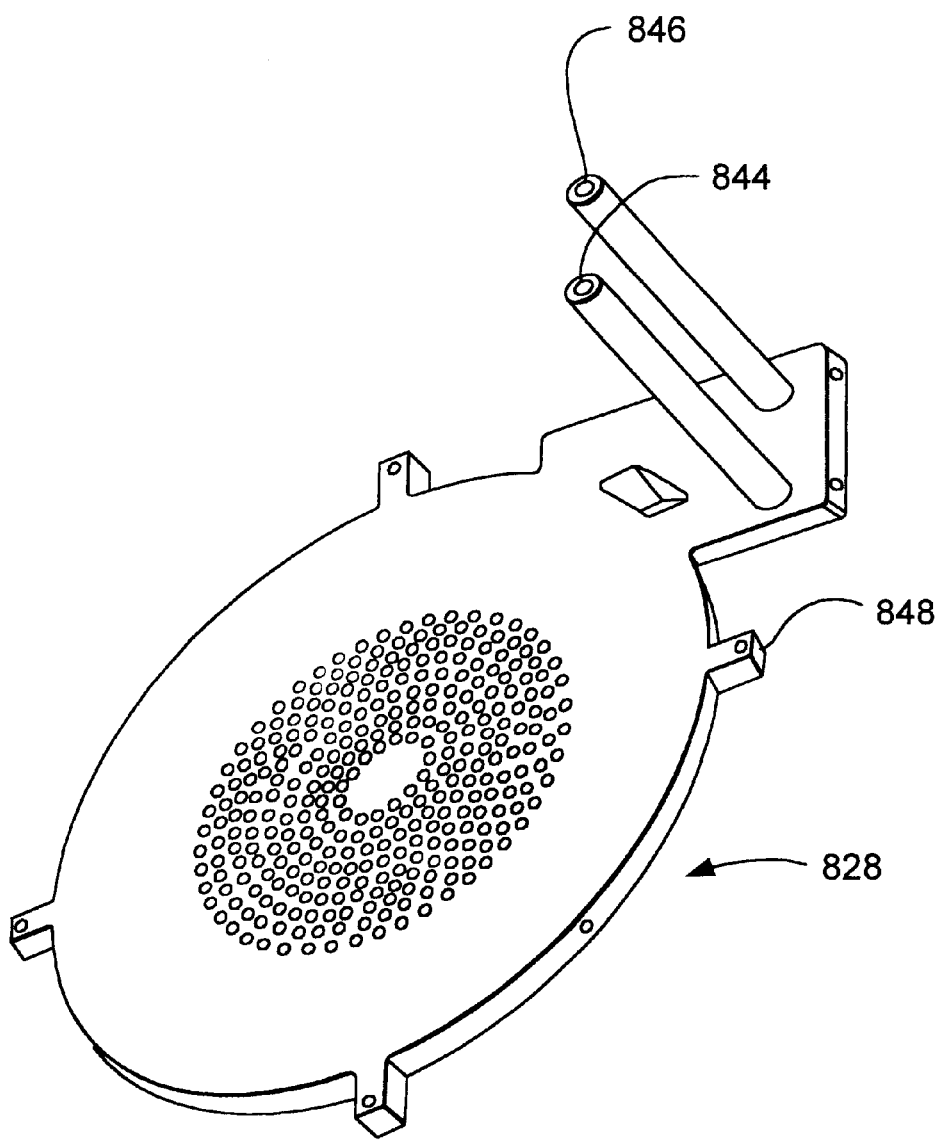

FIGS. 8A and 8B are a top plan view and perspective view of an exemplary diverter 828 with cooling channels 842, a coolant inlet 846 and a coolant outlet 844. As described in connection with FIG. 4, the diverter may be cooled to increase selectivity and to improve the stability of the temperature during processing. Water or another coolant is pumped into the inlet 846, circulates through cooling channels 842 and is removed from outlet 844. As described above, this mechanisms can be used to cool the diverter to about 25 degrees Celsius, for example.

The exemplary diverter of FIGS. 8A and 8B is made of aluminum and has a diameter of approximately 9 inches (for use in processing an 8 inch wafer). A larger diverter would be used for a 300 mm wafer. The wafer is connected to skirt 429 (in FIG. 4) by tabs 848. The tabs 848 space the main plate of the diverter about 0.5 inches from the skirt, so about a one half inch wide channel is formed around the periphery of the diverter to allow gas to flow through the channel toward the substrate and then predominantly around the edges of the substrate and to the backside. The holes in the center of the diverter (which allow gas to flow predominantly toward the first side of the substrate) have a diameter of about 0.1 inches and are angled toward the center of the substrate (as shown in FIG. 4) at an angle of about 30 degrees from perpendicular. The holes are formed in rings at diameters of about 1.5, 2, 2.5, 3, 3.5, 4, 4.5 and 5 inches. The diverter is about 0.5 inches thick. In the embodiment shown in FIG. 4, this diverter is typically spaced about 2 to 3 inches from the front surface of the substrate. In a specific embodiment, the pins 233 may be moved between two different processing positions, an "up" position and a "down" position. In the up position, the diverter is about 2.43 inches from the substrate and, in the down position, the diverter is about 2.62 inches from the substrate.

Figure 9:
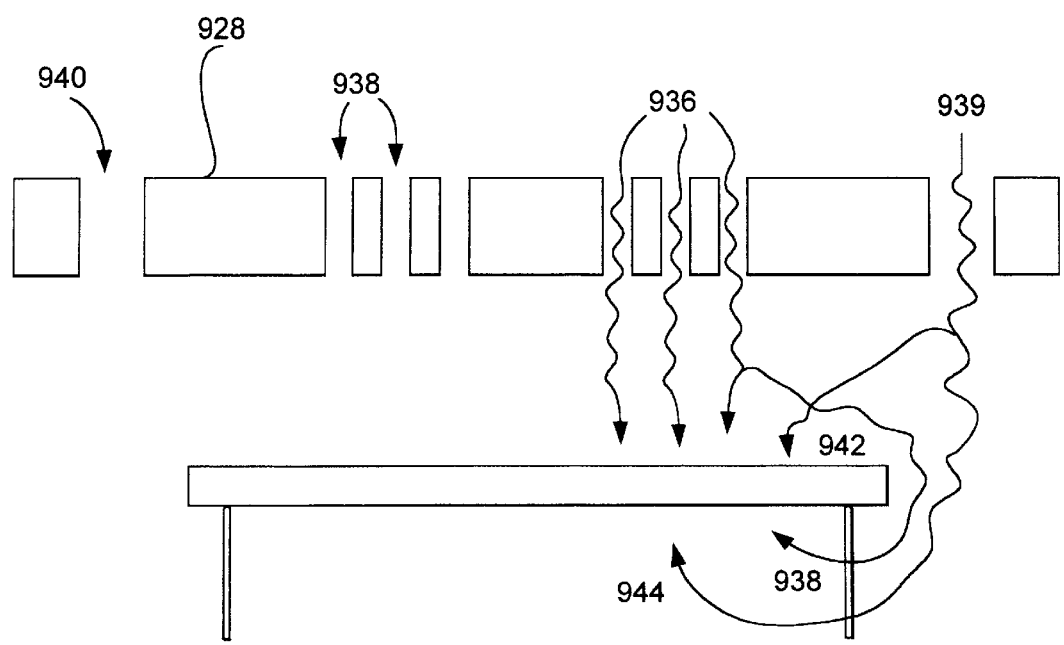
FIG. 9 is a side cross-sectional view of diverter illustrating the flow of gas in an exemplary embodiment of the present invention.

FIG. 9 demonstrates how the diverter controls the flow of gases to achieve the desired etch rate selectivity on the front side of the wafer, the desired front to backside etch rate ratio, and the desired etch rate uniformity on the backside of the wafer. Reactive species 936 flow through holes 938 of diverter 928, in a direction substantially normal to diverter 928, to accomplish the desired first side etching. Alternatively, gas 936 that has passed through the diverter may also proceed around to the other side of the wafer (indicated at 938) to accomplish the desired second side etching. Similarly, reactive species 939 may flow through slots 940 of diverter 928 (in a direction substantially normal to the diverter), to accomplish either first side etching as indicated at 942, or second side etching as indicated at 944.

Some of the reactive species from the generation chamber may approach the diverter in regions where there are no holes in the plate. This may result in flow in a radial direction, parallel to the diverter, to flow around the outside edge of the diverter (or through slot 940 if the outside edge is blocked by a skirt or wall). This gas may then provide reactive species to the first side of the wafer, similar to flow 942, or to the second side of the wafer, similar to flow 944. It will be appreciated that the predominate flow of species through holes 938 is toward the first side of the substrate, while the flow through slots 940 or around the edge of the diverter is predominantly toward the backside.

Figure 10A:
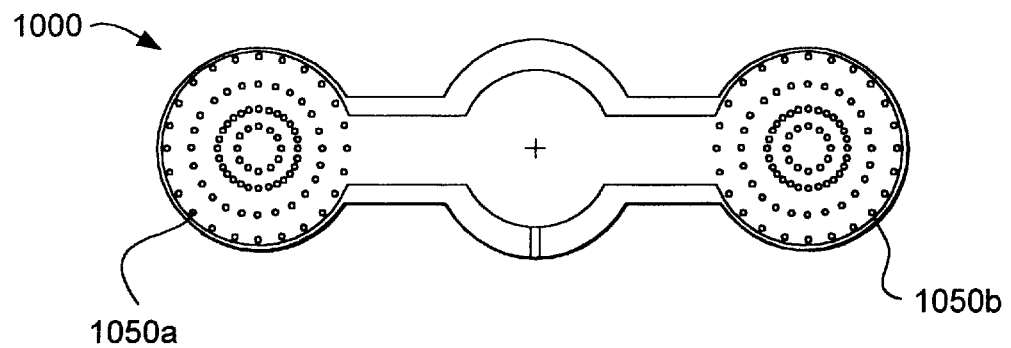
FIGS. 10A and 10B are a top plan view, and a side view, respectively, of a flow restricter which may be used in an exemplary embodiment of the present invention.
Figure 10B:
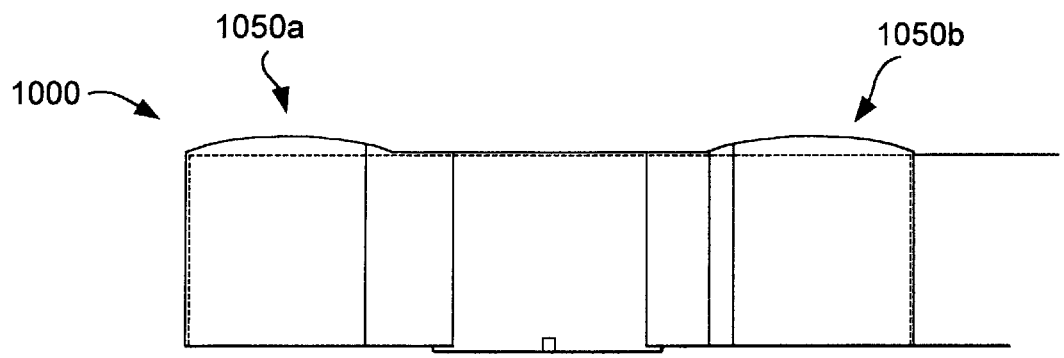

FIGS. 10A and 10B are a top plan view and a front side view, respectively, of an exemplary flow restricter generally indicated at 1000 which may be used, for example, in connection with the embodiment shown in FIG. 4. The flow restricter is placed over gas outlet 426. The flow restricter extends below each substrate processing station and forms a circular exhaust region 1050a and 1050b through which gas flows to be exhausted from the system. The center of the restricter to the center of each exhaust region is approximately 3.5 inches in the embodiment shown in FIG. 4. The diameter the exhaust regions is approximately 4.5 inches. Holes with a diameter of about 0.15 inches are formed in each exhaust region. The holes are formed in rings at diameters of about 0.95, 1.95, 2.95 and 3.95 inches. As shown in FIG. 10B, the exhaust regions are convex. At the peak of each exhaust region, the height of the restricter is about 4.23 inches and, at the periphery, is about 3.907 inches. In the embodiment shown in FIG. 4, this restricter is typically spaced about 1 to 2 inches from the back side of the substrate. In a specific embodiment, when the pins are in the up position, the restricter is about 1.3 inches from the substrate and, in the down position, the restricter is about 1.12 inches from the substrate.

Using the above exemplary embodiments, a variety of two sided etch processes may be performed in accordance with aspects of the present invention. In certain exemplary processes, it is desirable to operate at a lower power to increase selectivity, but this may cause deposition from certain gases, such as $CH_2F_2$, at the beginning of the process. To avoid this, an initial process step is performed without $CH_2F_2$ for about ten seconds to stabilize the plasma conditions. A mixture of $O_2$ and $CF_4$ may be used during this step, with a flow of about 250 SCCM of each. A power of 700 or 750 watts may be applied during this step.

After the above stabilization step, the following pressures, gases and flows may be used for etching in exemplary embodiments. In certain exemplary processes, gas supply system 204 and exhaust system 206 are configured to maintain a pressure in the generation chamber of between about 0.5 to 2 Torr, or any range subsumed therein, with 0.9, 1.0, and 1.1 being used in specific embodiments. The gas supply system 204 provides $CF_4$, $N_2$, $O_2$ and $CH_2F_2$ with a total flow rate ranging from about 500 to 1500 SCCM, or any range subsumed therein, with 900, 1050 and 1200 SCCM being used in specific embodiments. $CF_4$ may comprise from 15% to 30% of the flow in these exemplary embodiments, or any range subsumed therein, with 18%, 21.5% and 25% being used in specific embodiments. $N_2$ may comprise from 20% to 50% of the flow in these exemplary embodiments, or any range subsumed therein, with 25%, 32.5% and 40% being used in specific embodiments. $O_2$ may comprise from 20% to 40% of the flow in these exemplary embodiments, or any range subsumed therein, with 25%, 28.5% and 33% being used in specific embodiments. $CH_2F_2$ may comprise from 10% to 20% of the flow in these exemplary embodiments, or any range subsumed therein, with 13%, 15% and 18% being used in specific embodiments. The power system 218 applies power to induction coil 216 at between about 500 to 1500 watts, with 750 watts being used in specific embodiments.

Exemplary processes within the above ranges may be used, for example, to provide a nitride etch rate from 450 to 800 A/min or more, a nitride to oxide selectivity from 20:1 to 70:1 or more (with selectivity in excess of 40:1 for many of the exemplary processes), and a ratio of back to front side nitride etch rate in excess of 0.90 to 1.05 or more.

In one exemplary process, the following may be used: (i) a total flow rate of 1050 SCCM with 226 SCCM $CF_4$, 325 SCCM $O_2$, 341 SCCM $N_2$ and 168 SCCM $CH_2F_2$, (ii) a pressure of about 1.1 Torr, and (iii) a power of about 750 watts. This process may be used to provide a nitride etch rate of about 605 A/minute, a selectivity of about 41:1 and a back to front etch rate of about 1.03.

In another exemplary process, the following may be used: (i) a total flow rate of 1200 SCCM with 300 SCCM $CF_4$, 391 SCCM $O_2$, 300 SCCM $N_2$ and 209 SCCM $CH_2F_2$, (ii) a pressure of about 1.1 Torr, and (iii) a power of about 750 watts. This process may be used to provide a nitride etch rate of about 567 A/minute, a selectivity of about 43:1 and a back to front etch rate of about 1.05.

In another exemplary process, the following may be used: (i) a total flow rate of 900 SCCM with 162 SCCM $CF_4$, 335 SCCM $O_2$, 225 SCCM $N_2$ and 178 SCCM $CH_2F_2$, (ii) a pressure of about 1.1 Torr, and (iii) a power of about 750 watts. This process may be used to provide a nitride etch rate of about 583 A/minute, a selectivity of about 41:1 and a back to front etch rate of about 1.01.

In another exemplary process, the following may be used: (i) a total flow rate of 1200 SCCM with 216 SCCM $CF_4$, 329 SCCM $O_2$, 480 SCCM $N_2$ and 175 SCCM $CH_2F_2$, (ii) a pressure of about 1.1 Torr, and (iii) a power of about 750 watts. This process may be used to provide a nitride etch rate of about 482 A/minute, a selectivity of about 45:1 and a back to front etch rate of about 1.03.

For applications requiring higher selectivity, the flow of $CF_4$ relative to $O_2$ and $CH_2F_2$ may be decreased (although this also may decrease the nitride etch rate). For instance, $CF_4$ may be used in a range of from about 70 to 150 SCCM with a pressure of from about 0.7 to 1.3 Torr. The total flow of $O_2$ and $CH_2F_2$ ranges from about 500 to 700 SCCM. The nitride etch rate may range, for example, from about 400 to 100 A/minute or less, and the selectivity may range, for example, from 50 to 200 or more.

In other exemplary processes, $SF_6$ or $NF_3$ may be used instead of $CF_4$. The flow rates for $SF_6$ may range, for example, from 10–100 SCCM, with 25–50 SCCM being typical. The flow rates for $NF_3$ may range, for example, from 20 to 100 SCCM.

An example of the process trends that have been observed from exemplary processes will now be described. For this exemplary process using a power of 750 watts and a pressure of 900 milliTorr, the etch rate was greater than or equal to about 620 angstroms per minute, the uniformity was about 7.5% (1-σ), the back to front etch rate ratio was about 86%, and the nitride:oxide etch rate selectivity was greater than about 40:1.

If the pressure is increased by about 10% (in other words, by 100 milliTorr), the nitride and oxide etch rate rates remain substantially the same. However, the nitride etch rate uniformity worsens by about 5%, as the etch rate speeds up at the edge of the wafer. Similarly, the back to front etch rate ratio worsens (it decreases). Since the individual etch rates for the nitride and the oxide are unchanged, the etch rate selectivity is constant as well. There is no evidence of redeposition.

Exemplary process trends will now be described for the case where $CH_2F_2$ comprises about 18 percent of the total gas flow (i.e., 160 SCCM $CH_2F_2$ in a total gas flow of 860 SCCM). If the $CH_2F_2$ flow is increased from about 160 to about 255 SCCM, the oxide etch rate decreases by about 20% and the nitride to oxide etch rate selectivity increases by about 20%. Adding methanol lowers the throughput for a given selectivity. Addition of Nitrogen gas increases the etch rate ratio of silicon nitride to silicon oxide.

If the power to the plasma is increased from 750 to 1000 Watts, the nitride etch rate ratio increases from 600 to 900 angstroms per minute. Likewise, a power increase from 750 to 900 watts decreases the selectivity to 20:1.

With regard to the diverter, etch rate selectivities tend to decrease as the diameter of the diverter holes increase. The uniformity worsens if a diverter is positioned closer to a wafer than when it is in its optimal position, but the back to front etch rate ratio is better. A larger diverter does not significantly decrease the etch rate at the edge of a wafer.

Additional alternative diverters and reactors according to exemplary embodiments of the present invention will now be described. An alternative diverter is shown in FIGS. 11A and 11B, where diverter 1128 comprises two separate parallel plates 1128a and 1128b. The diverter in FIGS. 11A and 11B may be configured so there is no direct line of sight between generation chamber 1102 and substrate 1124. This is depicted by showing ultraviolet rays (or ions) 1136 unable to travel through the plate in a direction perpendicular to the diverter and substrate. This configuration can be used to reduce ion bombardment or UV exposure of the substrate.

Figure 11:
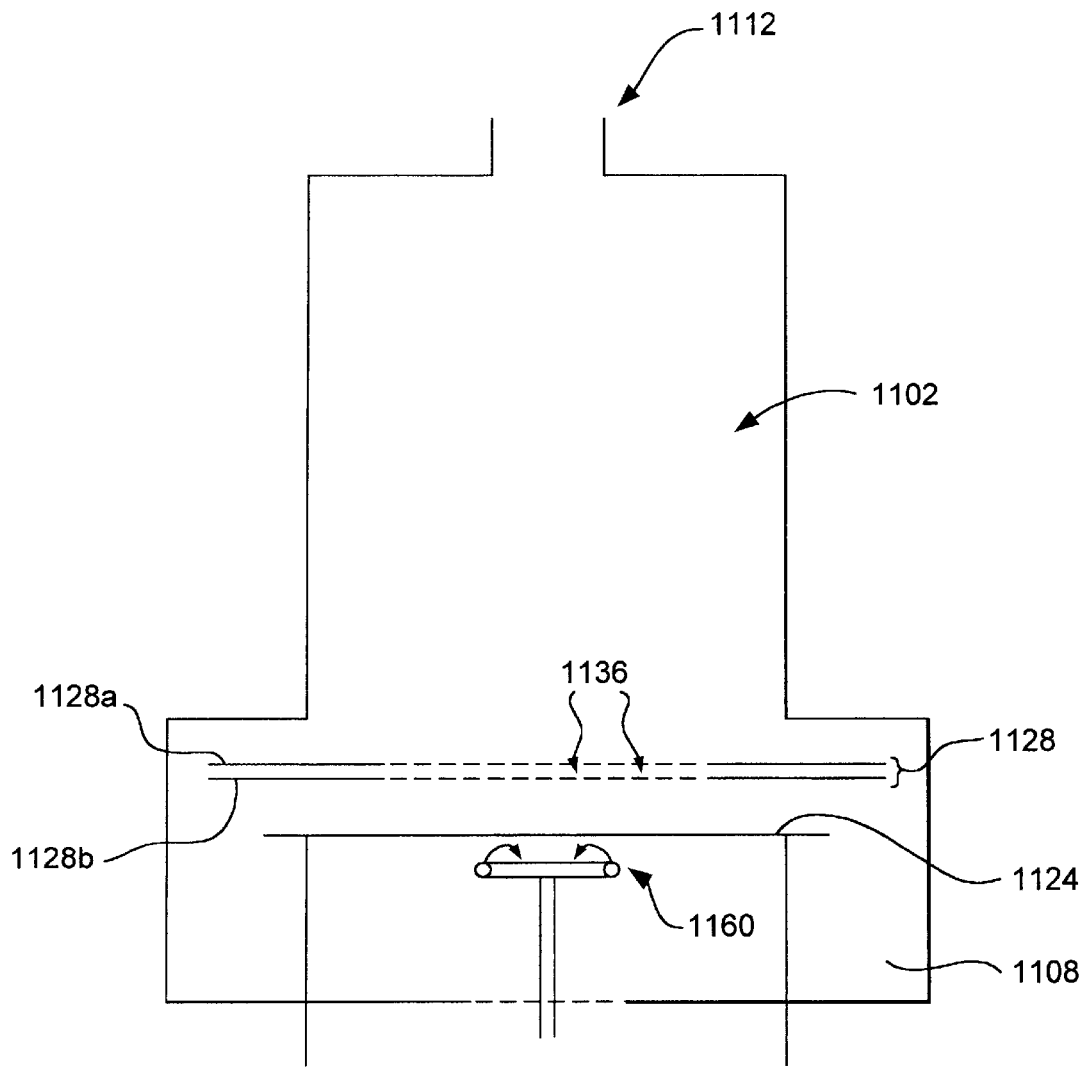
FIGS. 11–16 are side cross-section views of reactors with diverters according to alternate embodiments of the present invention.

A separate gas feed for the second side of the wafer may be included in the reactor system, as depicted by inlet 1160 in FIG. 11. The inlet may be in the form of a gas injection ring as shown at 1160. The purpose of inlet 1160 is to provide a gas flow directly to the second side of the substrate and hence a chemical etch of that side of the wafer; that is to say, an etch that is accomplished without the use of neutral radical species or ionized species (typical components of a plasma). Exemplary gases for facilitating the second side etch may include NO, $N_2O$ or $NO_2$ or a source of fluorine or other reactive gas. The gas flow may comprise, for example, up to 40% percent of the total gas flow into processing chamber 1108, where the total flow is the flow through inlet 1112 plus the flow through inlet 1160. A typical exemplary back side gas flow may be about 100 SCCM. It will be appreciated that a supplemental backside gas flow may be used in conjunction with any of the exemplary embodiments described herein. A second plasma source adjacent to the backside of the substrate may also be used to provide reactive species to the backside. In other embodiments, a plasma torch or other source may be used to generate reactive species which can be supplied through inlets on both sides of the substrate.

Figure 12:
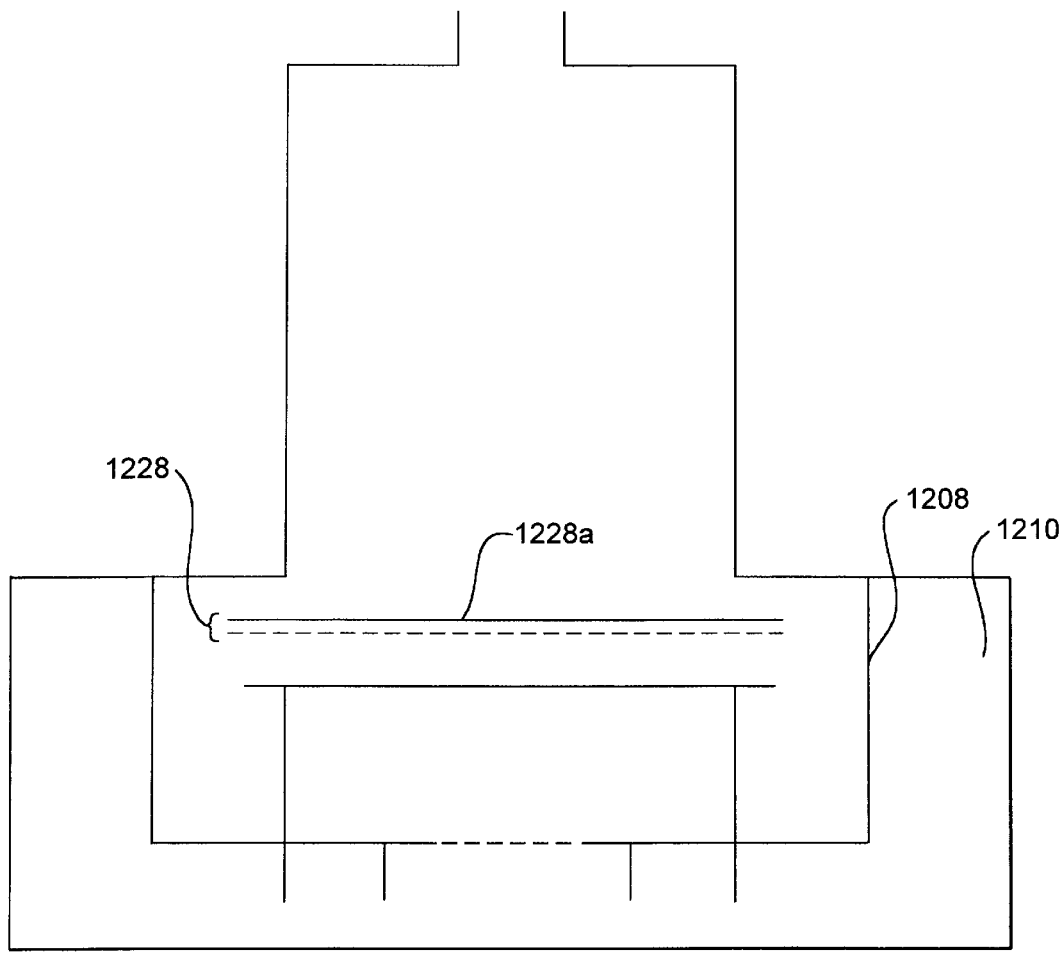

Referring to FIG. 12, processing chamber 1208 may be may be enclosed in a larger chamber as shown at 1210 in FIG. 12. The purpose of this is to keep the reactive species in a smaller volume defined by the dimensions of 1208. Cylindrical enclosure 1208 has a central axis substantially co-incident with an axis perpendicular to and through the center of the diverter and the substrate. The height of the walls of the cylinder (cylindrical enclosure) are typically less than the diameter of the substrate. The walls of the cylinder tend to keep the flow of reactive species symmetric with respect to the wafer and because of the limited volume imparts a small residence time of reactive species adjacent to the wafer. The cylinder may be formed from a non-reactive material, such as aluminum, Teflon, and/or quartz.

Figure 13:
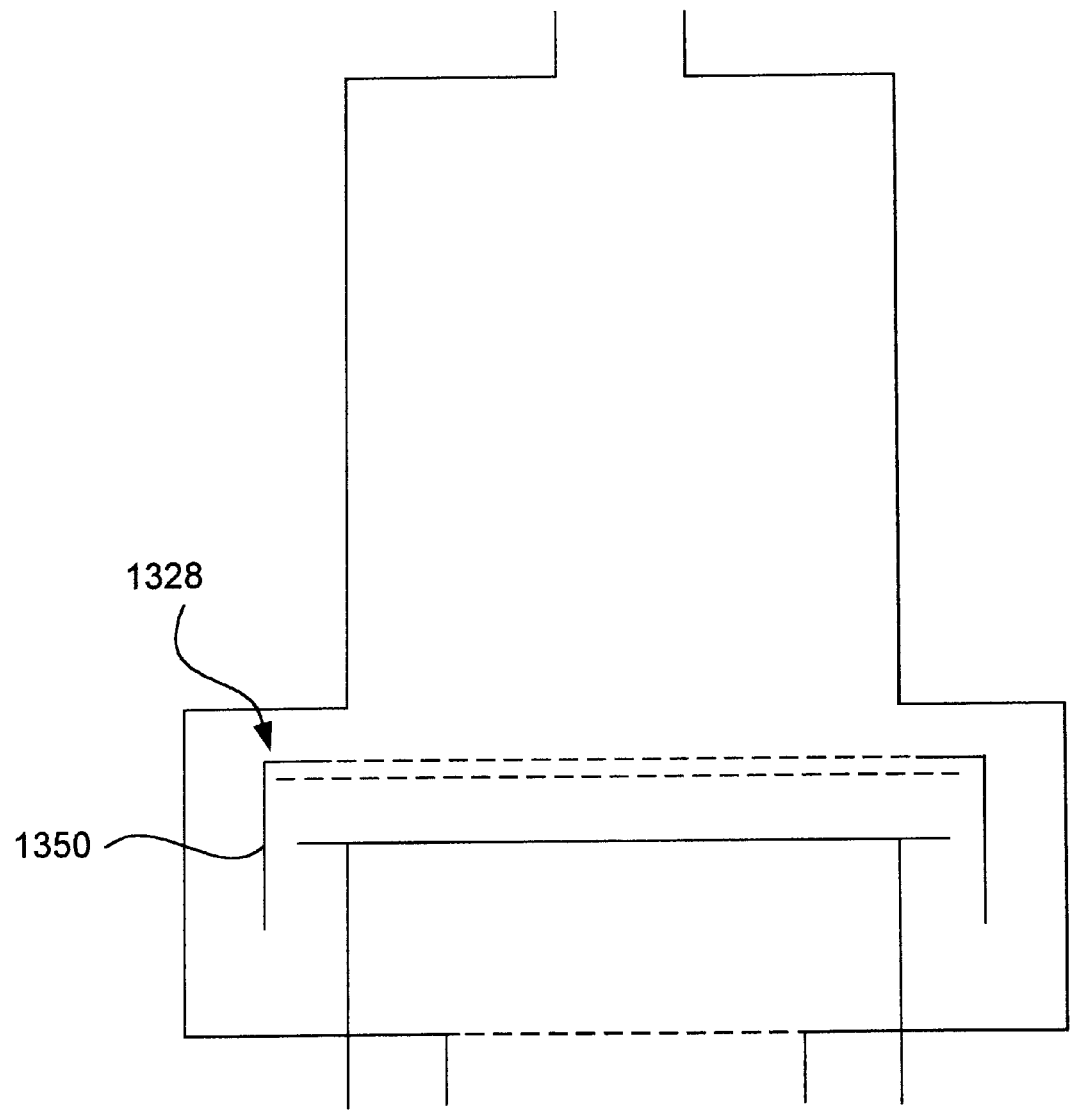
Figure 14:
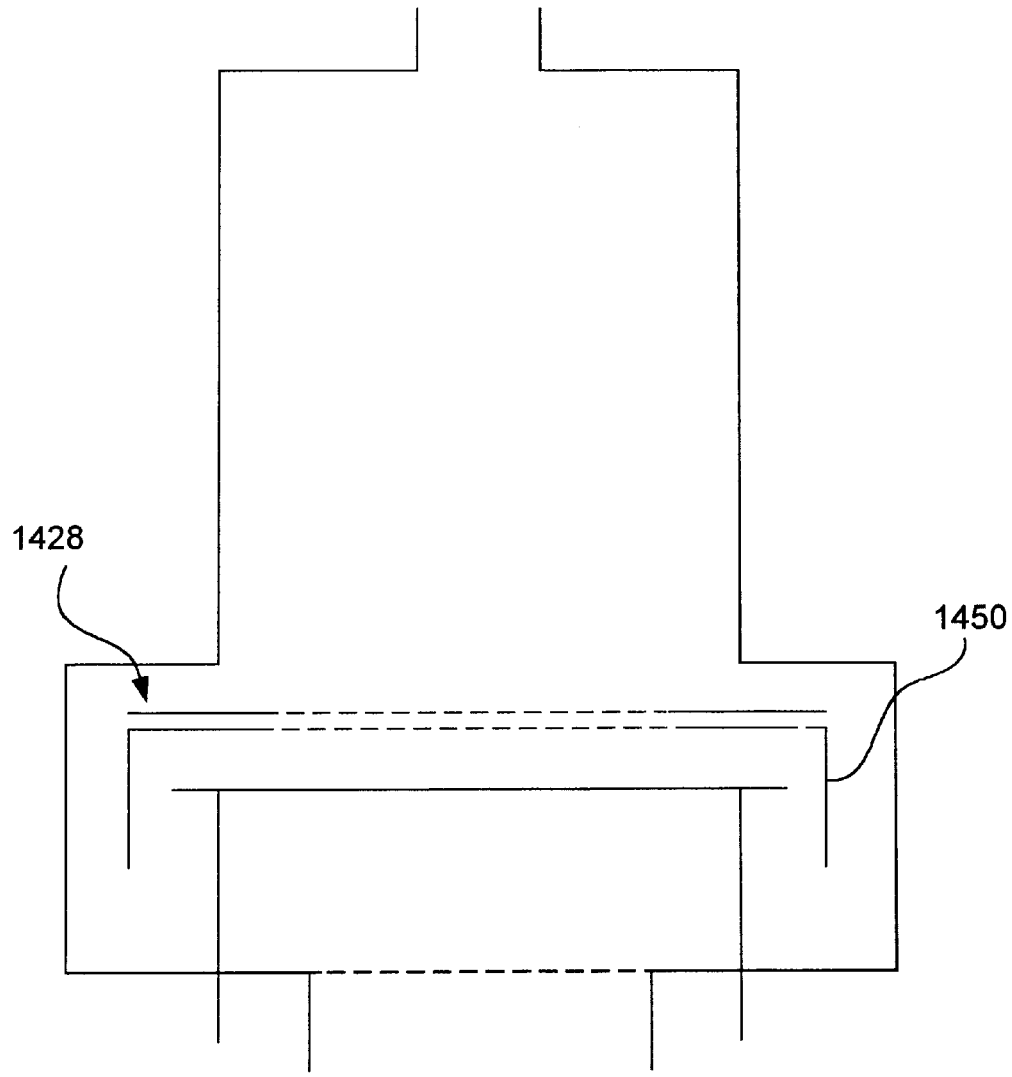
Figure 15:
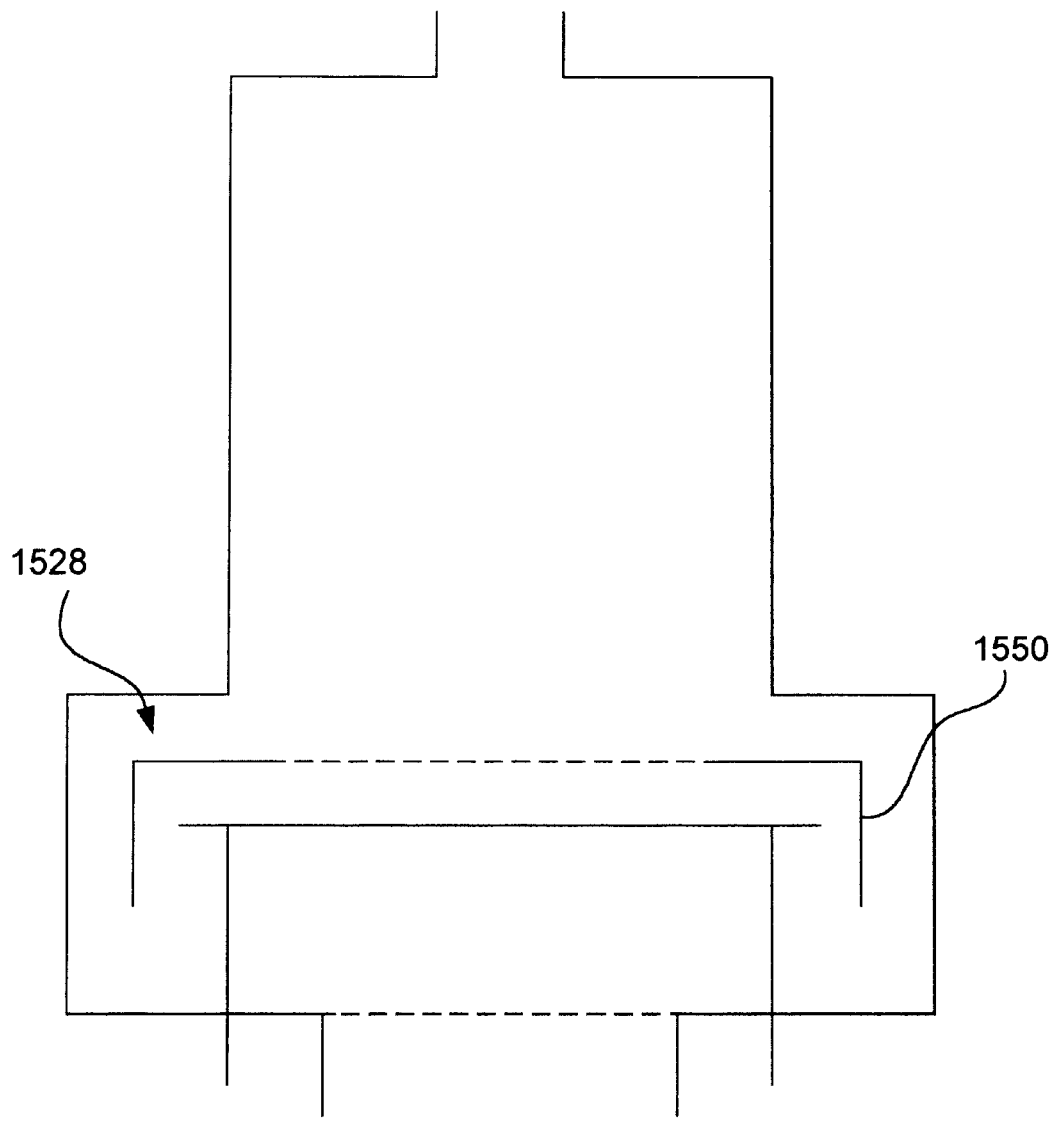

Alternate embodiments of the diverter and its placement in the chamber are shown in FIGS. 12–16. FIG. 12 shows a diverter 1228 comprising two parallel plates where top plate 1228a is a solid or blanket plate. FIG. 13 illustrates a diverter 1328 comprising two parallel plates having offset hole patterns, similar to the diverter discussed in FIG. 11. In the diverter of FIG. 13 there has been added a skirt 1350 extending down from the top plate of the diverter. The purpose of this skirt is to help divert gas flows to the second side of a substrate. Similarly, a skirt 1450 may extend downward from the bottom plate, as depicted in FIG. 14. The skirt may also be used with the single plate diverter, and may extend down toward the wafer some distance. The skirt may extend less than the distance to the wafer, to the edge of the wafer or beyond the wafer, as required to achieve the desired process characteristics. FIG. 15 shows a single plate diverter 1528 with skirt 1550. It will also be appreciated that skirts used in the embodiments of FIGS. 2, 3 and 4 (for instance as indicated at 229 in FIG. 2 and 429 in FIG. 4) may extend further down toward or past the edge of the substrate in some embodiments.

The above diverter, cylinder, flow restricter, and combinations thereof can be used to achieve the following: 1) divert some of the gas flow to the backside of the substrate to remove unwanted material from the backside of the substrate, 2) screen plasma from the front side of the substrate to reduce oxide etch rate, thereby improving the nitride:oxide selectivity, and 3) improve front and backside etch rate uniformities.

Figure 16:
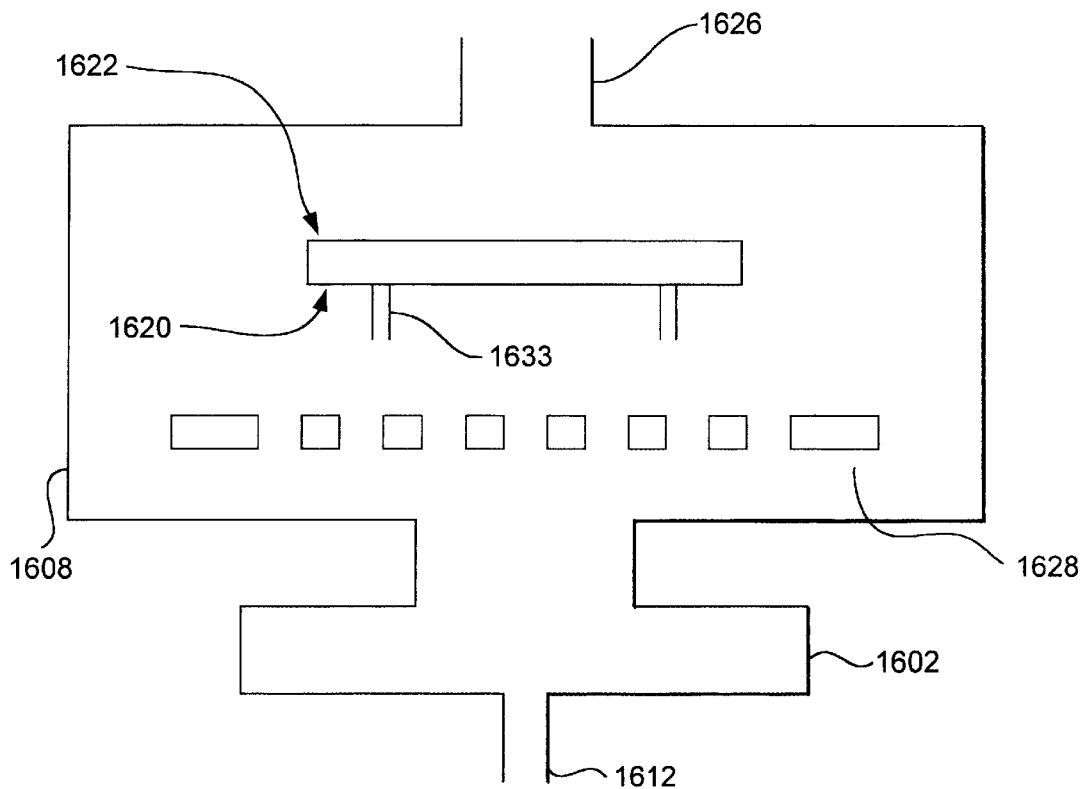

In an alternative embodiment shown in FIG. 16, the plasma may be generated beneath the substrate. In this configuration the generation chamber 1602 and diverter 1628 may be placed underneath the substrate so that the first portion of the flow of reactive species is to the backside of the substrate, and the diverted second portion of the flow goes around the substrate to the front side of the substrate. This is illustrated in FIG. 16, where feed gas inlet 1612 is at the bottom of the reactor system. Gas inlet 1612 feeds gas to generation chamber 1602. Reactive species generated in chamber 303 diffuse to process chamber 1608 and are exhausted through outlet 1626. Diverter 1628 plays a role similar to before, except that this time the flow of gas that is substantially perpendicular to the diverter (i.e., goes through the diverter) is primarily responsible for etching the backside of wafer 1620 and the flow of gas around the diverter is primarily responsible for etching front side of wafer 1622. Again, the wafer is supported on pins 1633, so that simultaneous front side and backside etching is achieved.

In exemplary embodiments of the present invention, a nitride:oxide etch rate selectivity of at least 30:1, and a nitride etch rate ratio of the second side to the first side of the substrate of at least 85 percent may be achieved. A nitride to oxide etch rate selectivity of at least 30:1 and a nitride etch rate uniformity on the second side of the substrate of 25 percent or less may also be achieved.

Many modifications of the exemplary embodiments of the invention disclosed above will readily occur to the skilled in the art. Accordingly, the invention is to be construed as including all structure and methods that fall within the scope of the appended claims.

What is claimed is:

1. A method for removing nitride from a semiconductor substrate having nitride on a first side and a second side of the substrate, the method comprising:

providing a gas flow to a processing chamber, including a source of fluorine, a source of hydrogen and a source of oxygen;

generating a reactive species from the gas for removing the nitride from the substrate;

flowing at least a first portion of the reactive species across the nitride on the first side of the substrate and simultaneously flowing at least a second portion of the reactive species across the nitride on the second side of the substrate; and diverting the second portion of the reactive species to bypass the first side and flow to the second side of the substrate for processing.

2. The method of claim 1 further comprising:

maintaining a pressure in the processing chamber between about 0.5 to 2 Torr.

3. The method of claim 1 further comprising:

wherein the source of fluorine includes $CF_4$, the source of oxygen includes $O_2$ and the source of hydrogen includes $CH_2F_2$.

4. The method of claim 3 wherein the flow of $CF_4$ is between about 15% to 30% of the gas flow, wherein the flow of $O_2$ is between about 20% to 40% of the gas flow.

5. The method of claim 4 wherein the gas flow is between about 500 to 1200 SCCM.

6. The method of claim 1 wherein an oxide is formed on the semiconductor substrate, the method further comprising:

selecting the relative flow of the source of fluorine, the source of hydrogen and the source of oxygen to provide a nitride to oxide selectivity of at least 20:1.

7. The method of claim 1 wherein the nitride to oxide selectivity is at least 40:1.

8. A method for removing nitride from a semiconductor substrate having nitride on a first side and a second side of the substrate, the method comprising:

providing a gas flow to a processing chamber, including a source of fluorine, a source of hydrogen and a source of oxygen;

generating a reactive species from the gas for removing the nitride from the substrate;

flowing at least a first portion of the reactive species across the nitride on the first side of the substrate and simultaneously flowing at least a second portion of the reactive species across the nitride on the second side of the substrate; and controlling the relative flow of reactive species to the first side and the second side of the semiconductor substrate such that the first side to the second side etch rate ratio is between about 0.90 to 1.05.

9. The method of claim 5 further comprising:

controlling the relative flow of reactive species to the first side and the second side of the semiconductor substrate such that the first side to the second side etch rate ratio is between about 0.90 to 1.05.

10. A method for removing nitride from a semiconductor substrate having nitride on a first side and a second side of the substrate, the method comprising:

providing a gas flow to a processing chamber, including a source of fluorine, a source of hydrogen and a source of oxygen;

generating a reactive species from the gas for removing the nitride from the substrate;

flowing at least a first portion of the reactive species across the nitride on the first side of the substrate and simultaneously flowing at least a second portion of the reactive species across the nitride on the second side of the substrate; and controlling the relative flow of reactive species to the first side and the second side of the semiconductor substrate such that the nitride etch rate on the second side is greater than the nitride etch rate on the first side.

11. A method for removing nitride from a semiconductor substrate having nitride on a first side and a second side of the substrate, the method comprising:

providing a gas flow to a processing chamber, including a source of fluorine, a source of hydrogen and a source of oxygen;

generating a reactive species from the gas for removing the nitride from the substrate;

flowing at least a first portion of the reactive species across the nitride on the first side of the substrate and simultaneously flowing at least a second portion of the reactive species across the nitride on the second side of the substrate; and providing a supplemental gas flow to the second side of the semiconductor substrate.

12. The method of claim 10 further comprising:

providing a power to the gas of between about 500 to 1500 watts.

13. A method for removing nitride from a semiconductor substrate having nitride on a first side and a second side of the substrate, the method comprising:

providing a gas flow to a processing chamber, including a source of fluorine, a source of hydrogen and a source of oxygen;

generating a reactive species from the gas for removing the nitride from the substrate;

flowing at least a first portion of the reactive species across the nitride on the first side of the substrate and simultaneously flowing at least a second portion of the reactive species across the nitride on the second side of the substrate; and supporting the semiconductor substrate on pins such that both the first side and the second side are exposed for processing.

14. A method for removing nitride from a semiconductor substrate having nitride on a first side and a second side of the substrate, the method comprising:

providing a gas flow to a processing chamber, including a source of fluorine, a source of hydrogen and a source of oxygen;

generating a reactive species from the gas for removing the nitride from the substrate;

flowing at least a first portion of the reactive species across the nitride on the first side of the substrate and simultaneously flowing at least a second portion of the reactive species across the nitride on the second side of the substrate; and cooling the semiconductor substrate to a temperature between about 0 degrees Celsius and 25 degrees Celsius.

15. The method of claim 7 further comprising cooling the semiconductor substrate to a temperature between about 0 degrees Celsius and 25 degrees Celsius.

16. The method of claim 9 further comprising cooling the semiconductor substrate to a temperature between about 0 degrees Celsius and 25 degrees Celsius.

17. The method of claim 14 further comprising:

diverting the second portion of the reactive species to bypass the first side and flow to the second side of the substrate for processing such that the first side to the second side etch rate ratio is between about 0.90 to 1.05.

18. The method of claim 10 further comprising cooling the semiconductor substrate to a temperature between about 0 degrees Celsius and 25 degrees Celsius.

* * * * *